(12) United States Patent
Ikari et al.

(10) Patent No.: US 8,163,140 B2
(45) Date of Patent: Apr. 24, 2012

(54) REACTIVE SPUTTERING METHOD AND DEVICE

(75) Inventors: Yoshimitsu Ikari, Hyogo (JP); Hiroshi Tamagaki, Hyogo (JP); Toshimitsu Kohara, Hyogo (JP)

(73) Assignee: Kobe Steel, Ltd., Kobe-shi (JP)

( * ) Notice: Subject to any disclaimer, the term of this patent is extended or adjusted under 35 U.S.C. 154(b) by 1759 days.

(21) Appl. No.: 10/515,730

(22) PCT Filed: May 26, 2003

(86) PCT No.: PCT/JP03/06583
§ 371 (c)(1), (2), (4) Date: Nov. 26, 2004

(87) PCT Pub. No.: WO03/100113
PCT Pub. Date: Dec. 4, 2003

(65) Prior Publication Data
US 2005/0205413 A1  Sep. 22, 2005

(30) Foreign Application Priority Data

May 29, 2002 (JP) ................................ 2002-156294
Aug. 19, 2002 (JP) ................................ 2002-238500

(51) Int. Cl.
*C23C 14/34* (2006.01)
(52) U.S. Cl. .......... 204/192.13; 204/298.03; 204/298.08
(58) Field of Classification Search ............. 204/192.12, 204/298.03, 298.08
See application file for complete search history.

(56) References Cited

U.S. PATENT DOCUMENTS 4,894,132 A * 1/1990 Tanaka ..................... 204/192.13
4,936,964 A * 6/1990 Nakamura ............... 204/192.13

(Continued)

FOREIGN PATENT DOCUMENTS

DE 4413045 10/1995

(Continued)

OTHER PUBLICATIONS

Sproul, W.D. et al. "Multi-Level Control for Reactive Sputtering", Society of Vacuum Coaters, 45th Annual Technical Conference Proceedings, pp. 11-15 2002.

(Continued)

*Primary Examiner* — Keith Hendricks
*Assistant Examiner* — Jason M Berman
(74) *Attorney, Agent, or Firm* — Oblon, Spivak, McClelland, Maier & Neustadt, L.L.P.

(57) ABSTRACT

The present invention provides a method for reactive sputtering in which a reactive sputtering apparatus including a sputtering vaporization source 2 provided with a metal target disposed in a vacuum chamber 1, a sputtering power source 4 to drive the sputtering vaporization source 2, and an introduction mechanism 5 to introduce an inert gas for sputtering and a reaction gas for forming a compound with sputtered metal into the vacuum chamber 1 is used, and reactive sputtering film formation is performed on a substrate 3 disposed in the above-described vacuum chamber, wherein the method includes the steps of performing constant-voltage control to control the voltage of the above-described sputtering power source 4 at a target voltage Vs and, in addition, performing target voltage control at a control speed lower than the speed of the above-described constant-voltage control, the target voltage control operating the above-described target voltage Vs in order that the spectrum of plasma emission generated forward of the above-described sputtering vaporization source 2 becomes a target value.

8 Claims, 18 Drawing Sheets

U.S. PATENT DOCUMENTS 5,963,320 A * 10/1999 Brooks et al. .................. 356/310
6,106,676 A * 8/2000 Terry et al. ............... 204/192.13

FOREIGN PATENT DOCUMENTS

| | | |
|---|---|---|
| EP | 0 416 241 | 3/1991 |
| EP | 0 430 229 | 6/1991 |
| EP | 0 508 359 | 10/1992 |
| EP | 1262574 | 12/2002 |
| JP | 62-180070 | 8/1987 |
| JP | 62-211378 | 9/1987 |
| JP | 4-136165 | 5/1992 |
| JP | 4-325680 | 11/1992 |
| JP | 2002-180247 | 6/2002 |

OTHER PUBLICATIONS

J. Affinito, R.R. Parsons: "Mechanisms of voltage controlled, reactive, planar magnetron sputtering of Al in Ar/N2 and Ar/02 atmospheres" J. Vac. Sci. Technol.A, vol. 2, No. 3, Jul. 1984,-Sep. 1984, pp. 1275-1284, XP002563322 Woodbury, USA p. 1275, right-hand columen-p. 1277, right-hand column; figures 1-2.

S.Schiller et al: "Deposition of hard wear-resistant coatings by reactive D.C. plasmatron sputtering" Thin Solid Films, vol. 118, No. 3, Aug. 17, 1984, pp. 255-270, XP002563324 Amsterdam, NL p. 261, line 6-p. 262, line 2 p. 269, line 12-22; figures 1-8.

* cited by examiner

REACTIVE SPUTTERING METHOD AND DEVICE

TECHNICAL FIELD

The present invention relates to a method and an apparatus for reactive sputtering in which a metal target is sputtered while a reaction gas is introduced and, thereby, a compound coating of the metal and the reaction gas is formed on a substrate.

BACKGROUND ART

The technology in which a sputtering vaporization source, such as a planar magnetron, is used and a metal target, e.g., an aluminum target is sputtered in an atmosphere of a reaction gas, e.g., oxygen ($O_2$), is a known technology for evaporating a film of a metal compound, e.g., alumina ($Al_2O_3$) at a high speed. It is always a technical problem to control such a reactive sputtering process and to control the component ratio of a film while the speed of evaporation or film formation is maximized.

The reactive sputtering is a very flexible coating technology, and allows various compound materials, e.g., $Al_2O_3$, to be produced by the use of an aluminum target and a reaction gas, $O_2$.

However, a significant problem has been included therein. More specifically, when the partial pressure of a reaction gas, e.g., $O_2$, reaches a level suitable for forming a film of a metal compound having a predetermined component ratio on a surface of a substrate, formation of the same metal compound also starts on a surface of the metal target. As a result of the formation of the metal compound on the surface of the target, the amount of metal which vaporizes from the target is reduced, and a film formation speed is lowered. In this manner, the amount of vaporized metal capable of reacting with the reaction gas in a chamber is reduced and, thereby, the partial pressure of the reaction gas in the chamber is increased.

Consequently, as shown in FIG. 1, the characteristic of the relationship between the change in the amount of the reaction gas introduced into the chamber and the reaction gas partial pressure in the process of increase of the reaction gas flow rate is different from that in the process of reduction while an electric power of the sputtering is kept constant, and in the characteristics exhibited, the reaction partial pressure jumps discontinuously.

At this time, in the condition in which the partial pressure is low as indicated by A shown in the drawing, although the film formation speed is high, generally, a coating containing excess metal tends to be formed. Under this condition, the sputtering target is kept in the state in which the metal is exposed at the surface, and this film formation condition is referred to as "a metal mode". Conversely, in the condition in which the partial pressure is high as indicated by B shown in the drawing, a compound coating made from the metal and the reaction gas is formed on the substrate. Under this condition, the compound is also formed on the surface of the sputtering target, and the film formation speed is significantly reduced compared with that in the metal mode. This film formation condition is referred to as "a poisoning (pollution) mode".

As described above, transition between the two modes, the metal and the poisoning modes, occurs rapidly, and as a result, it may be difficult that such a reactive sputtering and the formation of compound at a high rate become mutually compatible.

In order to overcome the above-described instability of the reactive sputtering, the following various methods for controlling the film formation have been proposed.

1. A method in which the reaction gas partial pressure in a chamber is monitored, and the amount of introduction of the reaction gas is adjusted (refer to Japanese Unexamined Patent Application Publication No. 4-136165).

2. A method in which the plasma emission intensity is monitored, and the flow of the reaction gas is adjusted (refer to Japanese Unexamined Patent Application Publication No. 7-94045, Japanese Unexamined Patent Application Publication No. 62-211378, and Japanese Unexamined Patent Application Publication No. 62-180070).

3. A method in which the sputtering voltage is monitored, and the flow of the reaction gas is adjusted to keep the sputtering voltage constant (refer to Japanese Unexamined Patent Application Publication No. 4-325680).

4. A method in which the voltage of the sputtering power source is controlled at constant.

With respect to a technology proposed as the above-described first method, in a reactive sputtering of, for example, aluminum and oxygen, the partial pressure of $O_2$ in a chamber is monitored, and when a reduction of the pressure of oxygen is detected, the flow of $O_2$ is increased, so that the reactive sputtering of aluminum is controlled, and compounds, such as $Al_2O_3$, are formed.

In this method, an oxygen flow valve is controlled in order to keep an oxygen gas partial pressure constant and, thereby, the sputtering process is controlled.

By the use of this control, the above-described discontinuous characteristic between the reaction gas and the partial pressure can be stabilized, and as shown in FIG. 2, stabilization can be achieved due to the characteristic having a reverse slope between the reaction gas flow rate and the gas partial pressure. As a result, it is believed that the compound can be formed at a high speed. This film formation region between the two modes, the metal and the poisoning modes, is referred to as "a transition mode".

The above-described second method is a method in which plasma emission spectrum is monitored, and the flow of the reaction gas is controlled. In this method, the plasma emission of the glow discharge causing sputtering is spectroscopically analyzed, and the spectral intensity thereof is brought into correspondence with the amount of metal sputtering-vaporized and the partial pressure of the reaction gas, so that the control is performed.

In the most frequently used technique of this method, the emission of the wavelength band intrinsic to a metal element in the plasma emission is used.

A metal is vaporized by sputtering with only an inert gas without introducing any reaction gas, the emission intensity of the wavelength band intrinsic to the metal element is monitored, and this emission intensity is referred to as Im (Max). When a reaction gas is introduced and the reactive sputtering is effected, the formation of a compound on a target is started, and a reduction of the amount of sputtering vaporization is started. The amount of metal element present in the glow discharge is decreased with this reduction of the amount of sputtering vaporization and, thereby, the emission intensity Im of the wavelength band intrinsic to the metal element is reduced.

In this method, the amount of introduction of the reactive gas is controlled in order that this Im becomes a predetermined proportion relative to the Im (Max), so that the film formation in the transition mode is realized, and many examples of success have been reported.

The above-described third method is a method in which the sputtering voltage applied to a sputtering cathode is monitored, and is set at a predetermined value by controlling the reaction gas flow rate.

As shown in FIG. 3, this takes advantage of the change of the voltage of the sputtering cathode depending on the film formation mode. For example, in the reactive sputtering through the combination of aluminum and oxygen, the voltage of the sputtering cathode takes on a value close to a high 400 V in the metal mode, the voltage of the sputtering cathode takes on a value in the neighborhood of a low 320 V in the poisoning mode, and a value in between them is taken on in the transition mode. Since the film formation mode can be determined by measuring the voltage of the sputtering cathode through the use of this characteristic, for example, the above-described Japanese Unexamined Patent Application Publication No. 4-325680 proposes to control the reaction gas flow rate in order that the voltage of the sputtering cathode becomes a desired value in the sputtering method by the use of two sputtering cathodes, referred to as a dual magnetron sputtering method.

With respect to the above-described fourth method in which the sputtering voltage is controlled at a constant value, the control of reactive sputtering of an AlN film by the use of an aluminum target and an Ar/N2 sputtering gas mixture is disclosed in the Journal of Vacuum Science Technology, A20 (3), pages P376 to 378, March 1982, "Voltage Controlled, Reactive Planar Magnetron Sputtering of AlN Thin Films" by McMahon, Affinito, and Parson, and is studied in the Journal of Vacuum Science Technology, A2 (3), pages P1275 to 1284, July to September 1984, "Mechanisms of Voltage Controlled, Reactive Planar Magnetron Sputtering of Al in Ar/$N_2$ and Ar/$O_2$ Atmospheres" by Affinito and Parsons.

In these two papers, the control of gas supply, power, current, and voltage for forming an AlN thin film having a predetermined component ratio by the reactive sputtering of aluminum in an argon/nitrogen mixed gas is discussed.

In the above-described papers, authors concluded that the constant gas flow rate and the control of the voltage were most suitable for reactive planar magnetron sputtering of aluminum.

The inventors of the present invention conducted experiments by the use of an aluminum target and oxygen serving as a reaction gas, and also verified that the method in which a sputtering power source was operated in a voltage control mode was effective at controlling the discharge of sputtering to the transition mode.

FIG. 4 shows the voltage-current characteristic of a sputtering cathode in the case where this voltage control was used. It is shown that when the sputtering power source was subjected to the current or power control, the characteristic (broken line) exhibited a discontinuous jump of the discharge mode and stable discharge was impossible in the transition mode, whereas when the voltage control was conducted (solid line), discontinuity of the discharge mode did not occur and the discharge was able to be stably operated in the transition mode.

In the above-described first method, the response time of the system is slow. That is because the partial pressure of the reaction gas sampled from a sputtering chamber must be analyzed, the flow of the reaction gas into the sputtering chamber must be adjusted based on the results thereof, and the flow must be diffused into the inside of the chamber so as to effect a desired change in the reaction gas partial pressure.

If the apparatus is upsized, it is difficult to ensure stabilization by this control method due to the problem of this response time.

In the second method, the means used for the control is not the reaction gas partial pressure, that is, indirect information, but the emission intensity directly correlated to the amount of vaporization of the metal. Therefore, the controllability is believed to be better than that in the above-described technique through the use of the reaction gas partial pressure.

However, according to the experiments conducted by the inventors of the present invention, stable control was not able to be achieved, although the method was applied to the film formation in a large treatment volume. The reason is believed that even when the amount of introduction of the gas was changed, the diffusion in the inside of the chamber took a time, and the time elapsed before the occurrence of change in the sputtering method was increased.

In the above-described third method, according to the experiments conducted by the inventors of the present invention, it was difficult to stably fix the film formation mode to the transition mode. The reason may be the same as that in the above-described second method.

The fourth method was effective with respect to even an apparatus having a large chamber. The reason is believed that in the stabilization of the discharge mode by the voltage control of the sputtering power source, since the stabilization of the power source voltage is performed by a constant-voltage control circuit in the inside of the sputtering power source, a factor of time delay, such as the diffusion of gas in the above-described system for controlling the flow rate of the reaction gas, is not included.

However, in the experiments on the fourth method, conducted by the inventors of the present invention, it was made clear that the following problems also occurred in this control system (the voltage control of the sputtering power source).

That is, in the style of this control system, the film formation mode is determined by a voltage command value to the sputtering power source, and the voltage-current characteristic is influenced by the other process conditions, such as the amount of introduction of the reaction gas and the amount of introduction of the discharge gas. For example, FIG. 5 shows the discharge characteristics in the case where the amount of introduction of the reaction gas is changed in the alumina film formation. The reactive sputtering can be stably controlled by the voltage control of the sputtering power source. However, it is observed that the curve of the voltage-current characteristic tends to shift toward higher sides of both the voltage and the current as the amount of introduction of the reaction gas is increased. Consequently, even when the voltage of the sputtering power source is set at a constant value, there is a problem of shift from a predetermined mode due to the above-described change in the characteristic values.

For example, in the case where the sputtering voltage is controlled at a voltage Vs in an example shown in FIG. 5, when the reaction gas flow rate is low (A), it is possible to control to the transition mode, whereas when the reaction gas flow rate is high (B), the film formation is performed in the poisoning mode.

Similar problems occur due to the amount of a residual gas in the chamber. In particular, in the case where a plurality of substrates are mounted, and film formation is performed by raising the temperature of the substrates, even when the amount of introduction of the reaction gas is the same, the shift (C) of the voltage-current characteristic occurs under the influence of the gas release from the substrates, and a constant film formation mode cannot be kept only by keeping the sputtering voltage constant.

Furthermore, in the case where the type of film to be formed is an insulating coating, such as alumina, an increase (D) of the voltage occurs with a lapse of the film formation time under the influence of the insulating film deposited on not only the substrate but also the chamber. Consequently, it is difficult to keep the film formation mode only by the voltage control in this case as well.

DISCLOSURE OF INVENTION

Accordingly, it is an object of the present invention to provide a method and an apparatus for reactive sputtering which overcome the above-described problems included in the known technology and which can perform stable and high-speed film formation.

More specifically, even when the chamber and the number of substrates mounted are relatively large, the reactive sputtering can be stably performed in the transition mode in which a compound film can be formed at a high speed.

In order to achieve the above-described objects, the present invention provides the following means. That is, the present invention provides a method for reactive sputtering in which a reactive sputtering apparatus including a sputtering vaporization source provided with a metal target disposed in a vacuum chamber, a sputtering power source to drive the sputtering vaporization source, and an introduction mechanism to introduce an inert gas for sputtering and a reaction gas for forming a compound with sputtered metal into the vacuum chamber is used, and reactive sputtering film formation is performed on a substrate disposed in the above-described vacuum chamber, the method characterized by including the steps of performing constant-voltage control to control the voltage of the above-described sputtering power source at a target voltage Vs and, in addition, performing target voltage control at a control speed lower than the speed of the above-described constant-voltage control, the target voltage control operating the above-described target voltage Vs in order that the spectrum of plasma emission generated forward of the sputtering vaporization source becomes a target value.

That is, the present invention is characterized in that two types of control technique having different feedback control speeds are combined.

In the sputtering method described in the above-described background art, simply one control loop is used for the purpose of stabilizing the reactive sputtering having an intrinsically unstable factor in a predetermined film formation mode. On the other hand, the present invention is characterized in that two control systems having different purposes and functions are combined, wherein the control systems include a relatively high-speed feedback control system for the purpose of stabilizing the film formation mode and a relatively low-speed feedback control system for the purpose of ascertaining the film formation mode and settling the film formation mode in a predetermined state.

A first feedback control system (constant-voltage control) of the present invention takes advantage of the fourth technique to stabilize the reactive sputtering shown in the known technologies. That is, in the present invention, the discharge voltage of the sputtering cathode is controlled at a certain constant value Vs. The purpose of this control is to establish stable operation of the reactive sputtering in each of three types of mode, i.e. the metal mode, the transition mode, and the poisoning mode. In particular, in order to settle the amount of the compound formed on the sputtering cathode surface in the transition mode at a predetermined value, the feedback control to read the voltage of the sputtering cathode and to adjust the power source output in order that the voltage of the sputtering cathode is brought into agreement with the Vs is performed at a speed adequately higher than the speed of the formation of the compound on the target surface.

Although the film formation mode of the reactive sputtering can be stabilized by the above-described constant-voltage control, this constant-voltage control cannot control the film formation mode of the reactive sputtering in a predetermined state, as described in the problems of the known technologies. This is because the relationship between the sputtering voltage and the film formation mode fluctuates under the influence of various process conditions, e.g., the amount of introduction of the reaction gas, the amount of introduction of the inert gas, the residual gas in the chamber, deposition of the insulating coating in the chamber, the mounting condition of the substrate, and consumption of the target.

Consequently, in the present invention, in order to eliminate the factors responsible for the fluctuations and to establish the predetermined film formation mode, the spectrum of plasma emission of the glow discharge at the front of the sputtering cathode is used as a second feedback control system. That is, the target voltage control is performed at a control speed lower than the speed of the above-described constant-voltage control, the target voltage control operating the above-described target voltage Vs in order that the spectrum of plasma emission generated forward of the above-described sputtering vaporization source becomes a target value.

By differentiating the control speeds, two types of control can be prevented from interfering with each other and from becoming unstable.

In the present invention, preferably, the target value of the above-described spectrum is set based on a ratio of a spectral intensity Im of the wavelength band intrinsic to the metal element in the plasma emission to a spectral intensity Ig of the wavelength band intrinsic to the reaction gas.

Alternatively, the target value of the above-described spectrum can be set based on a ratio of a spectral intensity Im of the wavelength band intrinsic to the metal element in the plasma emission to a spectral intensity Ia intrinsic to the inert gas.

FIG. 6 shows an example of experiments on alumina film formation conducted by the inventors of the present invention. These data indicate the results derived from the change in the sputtering current and the change in the emission spectrum with the change in the target voltage Vs of the control while the sputtering cathode is subjected to voltage control under various process conditions.

The data taken from the emission spectrum are organized in terms of a ratio, Im/Ig, of the emission intensity Im of the wavelength (670 nm) intrinsic to aluminum to the emission intensity Ig of the wavelength (778 nm) intrinsic to oxygen, and are plotted on a graph.

According to the results of the present experiment, each plot of the sputtering voltage vs the sputtering current is a curve in the shape of the letter S. The upward-sloping regions in the low voltage region and the high voltage region correspond to the poisoning mode and the metal mode, respectively, and the down-sloping region therebetween corresponds to the transition mode. Here, it is determined from values of Im/Ig written on the shape of the letter S that:

Im/Ig<1 corresponds to the poisoning mode;
1<Im/Ig<4 corresponds to the transition mode; and
4<Im/Ig corresponds to the metal mode, regardless of the process conditions and, thereby, it is clear that the film formation mode can be set based on the value of Im/Ig serving as an indicator.

In the above description, it is shown that the ratio of Im/Ig is used as the indicator, as an example. However, in addition to this, various information attained from the spectrum of the emission can be used in combination to select the indicator, for example, a ratio of Im to the spectral intensity Ia of the wavelength band intrinsic to the inert gas can be adopted as the indicator.

As described above, since the film formation mode can be ascertained based on the information attained from the emission spectrum, a predetermined film formation mode can be ensured by monitoring this information (indicator) and adding the control feedback loop (target voltage control) for adjusting the value Vs of the above-described constant-voltage control in order that the indicator becomes the predetermined value.

In the present invention, preferably, the control response time Tv of the above-described constant-voltage control is within the range of 0.1 milliseconds to 0.1 seconds and the control response time To of the above-described target voltage control is within the range of 0.1 seconds to 60 seconds.

In the present invention, "a control response time" is defined as a characteristic time which indicates a control speed of a closed-loop control, and as a time elapsed before the object amount of control reaches about 90% of the change of the target value when the control target value is changed stepwise.

According to the results of the experiments on alumina film formation conducted by the inventors of the present invention, the shift between the metal mode and the poisoning mode is observed in the case where the reaction gas flow rate is changed while the sputtering cathode is operated at a constant electric power, and this shift occurs within 1 second to several seconds.

Therefore, the control to make the voltage constant must be performed at a speed corresponding to a response time Tv of 0.1 seconds or less which is at least one order of magnitude shorter than this.

On the other hand, under present circumstances, a mainstay of the output control of the sputtering power source is the inverter control with a switching frequency of several tens of kilohertz, and a time span adequately longer than at least the switching period is required to change the output. Therefore, it is useless to reduce the control response time to 0.1 milliseconds (corresponding to 10 kHz) or less, and appropriate response time of the constant-voltage control is within the range of 0.1 milliseconds to 0.1 seconds.

In the above-described target voltage control, since a time span of at least about 10 milliseconds is required to stably take data of the emission spectrum, the control speed must be slower than this. Consequently, the control response time To must be longer than 0.1 seconds.

In the case where the film formation is performed while a plurality of substrates are mounted on a table and are revolved, the emission spectrum itself fluctuates under the influence of the substrates passing intermittently the front of the sputtering target at intervals of 0.1 seconds to several seconds. In such a case, the emission spectrum in a time span longer than the passing period must be averaged and be incorporated into the control and, therefore, slow control with the time constant To of about 10 seconds is preferable.

On the other hand, since the film formation process itself takes 10 minutes to several hours, extremely low-speed control is undesirable. Preferably, the time constant is on the order of 1 minute at a maximum.

According to the above-described experimental results, high-speed film formation can be performed in the stable transition mode by setting Im/Ig at 3, and setting the time constant of the control at 20 seconds.

In this manner, the film formation can be performed by the stable reactive sputtering which is the object of the present invention. In this case, the control indicator (Im/Ig or the like) based on the emission spectrum, the flow rate (or pressure) of inert gas (Ar or the like), and the reaction gas flow rate are set as parameters of the film formation condition. In this case, the sputtering voltage is determined by the control based on the emission spectrum, and the sputtering current is determined as a result of the voltage control.

In the above-described method according to the present invention, since the current or the electric power of the sputtering, which is a parameter correlated to the film formation speed, cannot be set directly, a problem may occur in that the film formation speed cannot be set.

When this becomes a problem, in the present invention, preferably, the reaction gas flow rate control is performed at a control speed lower than the speed of the above-described target voltage control, the reaction gas flow rate control operating the reaction gas flow rate of the above-described introduction mechanism in order that a sputtering current Ip or an electric power Pp of the above-described power source becomes a target value.

In this case, preferably, the control response time Ti of the above-described reaction gas flow rate control is 10 seconds to 1,800 seconds.

That is, the value of the current Ip or the electric power Pp supplied to the sputtering cathode is monitored, and the reaction gas flow rate is automatically controlled in order that the monitored value becomes a desired target value determined in advance.

In order to avoid mutual interference between the control loops, this reaction gas flow rate control must be performed at a speed lower than the speed of the above-described control (target voltage control) based on the emission spectrum, and in general, the control response time Ti thereof is preferably set at several times To or more.

In this manner, in the sputtering method of the present invention, the reaction gas flow rate and the sputtering voltage can be automatically controlled by inputting the target values of the inert gas flow rate and the sputtering current (or electric power) and the indicator based on the emission spectrum.

The film formation speed can be controlled at a predetermined value by this reaction gas flow rate control.

FIG. 7 is a graph showing the relationship between the amount of introduction of the oxygen gas and the discharge voltage at a constant discharge power in the above-described sputtering discharge of the aluminum metal target in an oxygen atmosphere, and is equivalent to that shown in the above-described FIG. 1. As is shown here, when the oxygen flow rate is increased gradually from a small rate at a constant sputtering power in a manner frequently used in usual sputtering film formation, the discharge voltage decreases rapidly at some point and, thereafter, becomes stable at a low value. Subsequently, when the oxygen flow rate is decreased gradually, the voltage increases rapidly at some point of the oxygen flow rate, and returns to a high value, so that the route thereof exhibits hysteresis. The conditions shown in FIG. 7 are referred to as "metal mode", "poisoning mode", and "transition mode" located between the two, respectively.

The characteristic curve shown in FIG. 6 can be classified into respective discharge modes as in FIG. 7. The region of the relatively high sputtering voltage is the metal mode, the region of the low sputtering voltage is the poisoning mode, and the region exhibiting the characteristic reverse to them is the transition mode.

According to the experiments conducted by the inventors of the present invention, it was made clear that the characteristic curve shown in the above-described FIG. 6 was shifted or deformed depending on the differences in the reaction gas flow rate and the condition of the inside of the vacuum chamber during the film formation.

FIG. 8 shows a specific example thereof. When the reactive gas flow rate is increased to higher than that in the case where the characteristic curve indicated by a solid line is derived, the characteristic curve is shifted as indicated by a broken line. Even when the reactive gas flow rate is the same as that in the case indicated by the solid line, the characteristic curve is deformed as indicated by alternate long and short dashed lines when, for example, the amount of residual gas in the inside of the chamber is large.

This refers to that in the case where the sputtering discharge is started at a constant sputtering voltage, respective discharge points on the characteristic curve are different depending on the difference in the reaction gas flow rate, or depending on the residual gas in the chamber, the deposition of the compound coating on the inner surface of the chamber, the mounting condition of the substrate, a consumption state of the target, and the like, even when the amount of introduction of the reaction gas is set at a constant value, and by extension, the quality of the film formed is also influenced.

Specifically, in the case where the amount of sputtering vaporization of metal is relatively large, for example, when a target is nearly completely new, even if the discharge at a target point in the transition mode region is attempted, there is a high possibility that the discharge is performed at a point nearer to the metal mode region than is the target point. As a result, a compound film containing excess metal is formed. Once the compound film containing excess metal is formed, even when the discharge point is returned to the target point, there is a problem in that the crystallinity and the transparency of the compound film formed are deteriorated.

Furthermore, that the characteristic curve is shifted or deformed depending on the reaction gas flow rate and the conditions in the inside of the chamber as shown in the above-described FIG. 8 refers to that the sputtering currents are different on occasions even when the sputtering voltage is constant and, thereby, inconveniencies occur.

Specifically, since the sputtering current is increased as the residual gas in the chamber and deposition of the compound coating on the inner surface of the chamber are increased, there is a problem in that the sputtering current value may exceed the allowance of the sputtering power source.

Accordingly, it is an object of the present invention to provide a method for reactive sputtering which overcomes the above-described problems and which can stably keep the film formation in the transition mode region.

On the other hand, the inventors of the present invention considered the way to overcome the nonlinearity of the characteristic curve shown in the above-described FIG. 6 by monitoring the plasma emission spectrum.

As shown in FIG. 6, from the result of a plurality of experiments, it was found out that a ratio (Im/Ig) of the plasma emission intensity (Im) of the wavelength band intrinsic to a target metal to the plasma emission intensity (Ig) intrinsic to the reactive gas takes on a specific value on each point of the characteristic curve regardless of the amount of introduction of the reactive gas.

It is an object of the present invention to provide a method for reactive sputtering which can stably keep the film formation in the transition mode region based on the above-described findings.

In order to achieve the above-described object, the present invention provides the following means.

That is, the present invention provides a method for reactive sputtering in which a sputtering apparatus including a substrate and a sputtering vaporization source provided with a metal target disposed in a vacuum chamber, a power source to drive the above-described sputtering vaporization, and an introduction mechanism to introduce an inert gas for sputtering and a reaction gas for forming a compound with sputtered metal into the above-described vacuum chamber is used, the metal is sputtering-vaporized from the above-described sputtering vaporization source and, thereby, a compound coating of the metal and the reactive gas is formed on the above-described substrate while the above-described power source is controlled in order that a sputtering voltage Vp applied to the above-described sputtering vaporization source becomes a target voltage Vs, the method characterized by including the steps of controlling the above-described sputtering voltage in order that sputtering discharge is started in a poisoning mode region and, thereafter, controlling the sputtering voltage in order that the sputtering discharge is shifted to a transition mode region.

That is, as shown in FIG. 9, shift from a discharge point 1 to a discharge point 2 is effected.

In the present invention having the above-described configuration, sputtering is performed at a discharge point in the poisoning mode region at least immediately after the start of the sputtering discharge, and subsequently, the discharge point is shifted to the transition mode region by switching the sputtering voltage, so that formation of a compound film containing excess metal on the substrate due to the sputtering in the poisoning mode region can be prevented.

Furthermore, by the sputtering in the following transition mode region, a compound film can be formed at a speed higher than that in the poisoning mode region. At this time, since the discharge in the poisoning mode region is performed in advance, the compound film has been formed on the target surface and the inner surface of the chamber, the possibility of shift to the discharge point close to the metal mode region in the transition mode region is reduced.

In the present invention, preferably, the shift from the poisoning mode region to the transition mode region is effected by increasing the above-described sputtering voltage continuously.

That is, as shown in FIG. 10, shift from a discharge point 1 to a discharge point 2 is performed continuously.

When the sputtering voltage is switched from the poisoning mode region to the transition mode region, stable discharge may become difficult depending on the condition, e.g., consumption of the target, in the inside of the chamber. However, by increasing the sputtering voltage continuously, it becomes possible to shift to the transition mode region while the stable discharge in the poisoning mode region is maintained.

In the present invention, preferably, the amount of introduction of the reactive gas is set at an amount Q1 lower than a predetermined amount Q0 at the start of the sputtering discharge, the sputtering voltage is increased while the amount of introduction of the reactive gas is kept at the above-described Q1 so as to effect the shift to the transition mode region, and subsequently, the amount of introduction of the reactive gas is increased to the above-described predetermined amount Q0 while the transition mode region is maintained.

That is, as shown in FIG. 11, the discharge point is shifted as 1→2→3.

The reason will be described. In the case where the sputtering voltage is increased from the poisoning mode continuously, the sputtering current value is increased at the boundary between the poisoning mode region and the transition mode region. In this case, if the sputtering current value exceeds a maximum value allowable for stable operation of the apparatus, e.g., the allowable value of the current of the sputtering power source, the amount of introduction of the reaction gas into the chamber is temporarily reduced from the predetermined value adequately, so that the characteristic curve is shifted leftward, as shown in the above-described FIG. 8.

Subsequently, the sputtering voltage is increased to shift the discharge point from the poisoning mode region to the transition mode region and, thereafter, the amount of introduction of the reactive gas is returned to the predetermined value, so that the sputtering current value can be prevented from becoming too high.

At this time, when the sputtering discharge is started under the condition in which the amount of introduction of the reactive gas is somewhat large, formation of a compound film containing excess metal immediately after the start of the sputtering discharge can be prevented. Subsequently, the reactive gas flow rate is decreased and, thereby, the discharge point can be shifted from the poisoning mode region to the transition mode region.

That is, as shown in FIG. 12, preferably, the amount of introduction of the reactive gas is set at an amount Q2 lower than a predetermined amount Q0 at the start of the sputtering discharge, the reactive gas flow rate is reduced to the amount Q1 lower than the above-described Q2 while the poisoning mode region is maintained, the sputtering voltage is increased while the amount of introduction of the reactive gas is kept at the above-described Q1 so as to effect the shift to the transition mode region, and subsequently, the amount of introduction of the reactive gas is increased to the above-described predetermined amount Q0 while the transition mode region is maintained.

As shown in FIG. 13, preferably, the amount of introduction of the reactive gas is set at a predetermined amount Q0 at the start of the sputtering discharge, and subsequently, the sputtering voltage is increased while the amount of introduction of the reactive gas is adjusted in order that the sputtering current value does not exceed a predetermined value, so as to effect the shift to the transition mode region.

In the case where the amount of sputtering vaporization of metal is relatively large, for example, a target is nearly completely new, when the reactive gas flow rate is reduced to some degree in order to prevent the sputtering current from becoming excessive, the discharge point may become close to a point nearer to the metal mode region than is the target discharge point in the transition mode region even when the sputtering voltage is kept constant. However, by adjusting the reactive gas and the sputtering voltage continuously, the film quality of the compound film can be prevented from becoming in the state of containing excess metal.

Preferably, constant-voltage control is performed to control the above-described sputtering voltage at a target voltage Vs and, in addition, target voltage control is performed at a control speed lower than the speed of the above-described constant-voltage control, the target voltage control setting the above-described target voltage Vs in order that the spectrum of plasma emission generated forward of the above-described sputtering vaporization source becomes a target value.

Preferably, the target value of the above-described spectrum is set based on a ratio Im/Ig of a spectral intensity Im of the wavelength band intrinsic to the metal element in the plasma emission to a spectral intensity Ig of the wavelength band intrinsic to the reaction gas.

According to the present invention described above, discharge can be performed stably in the transition mode region, and high-speed film formation can be performed stably.

The present invention provides an apparatus for reactive sputtering in which a sputtering vaporization source provided with a metal target disposed in a vacuum chamber, a sputtering power source to drive the sputtering vaporization source, and an introduction mechanism to introduce an inert gas for sputtering and a reaction gas for forming a compound with sputtered metal into the above-described vacuum chamber are included, the apparatus characterized by including a spectroscope to detect and spectroscopically analyze plasma emission generated forward of the above-described sputtering vaporization source and a control unit to perform constant-voltage control to control the voltage of the above-described sputtering power source at a target voltage Vs and, in addition, to perform target voltage control at a control speed lower than the speed of the above-described constant-voltage control, the target voltage control operating the above-described target voltage Vs in order that the spectrum based on the above-described spectroscope becomes a target value.

Preferably, the above-described control unit performs the reaction gas flow rate control at a control speed lower than the speed of the above-described target voltage control, the reaction gas flow rate control operating the reaction gas flow rate of the above-described introduction mechanism in order that a sputtering current Ip or an electric power Pp of the above-described power source becomes a target value.

According to the present invention, high-speed film formation can be performed stably.

BEST MODE FOR CARRYING OUT THE INVENTION

The embodiments of the present invention will be described below with reference to the drawings.

Figure 14:
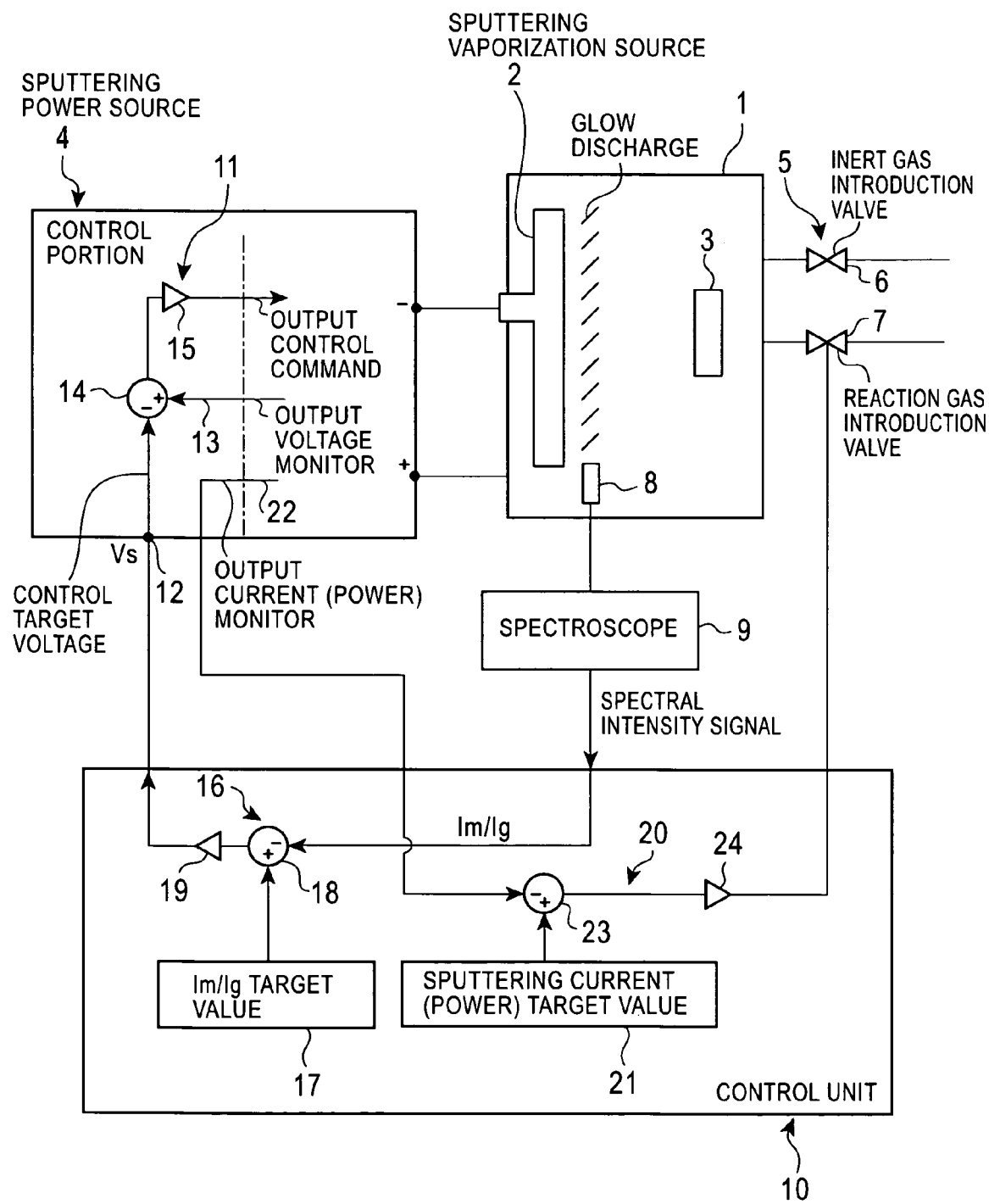
FIG. 14 is a block diagram of a reactive sputtering apparatus showing an embodiment of the present invention.

FIG. 14 is a block diagram of a reactive sputtering apparatus to perform a method of the present invention.

The reactive sputtering apparatus includes a vacuum chamber 1. A sputtering vaporization source 2 and a substrate 3 is disposed in this vacuum chamber 1. The sputtering vaporization source 2 is composed of a planar magnetron, and a metal target is attached to the front thereof.

A sputtering power source 4 to drive the above-described sputtering vaporization source 2 is disposed. In this power source 4, the metal target of the above-described sputtering vaporization source 2 serves as a cathode and the vacuum chamber 1 serves as an anode.

A gas introduction mechanism 5 is connected to the above-described vacuum chamber 1. This introduction mechanism 5 includes an inert gas introduction valve 6 to introduce an inert gas for sputtering into the vacuum chamber 1, and a reaction gas introduction valve 7 to introduce a reaction gas for forming a compound with sputtered metal. Each of these introduction valves 6 and 7 is an automatic control valve and the flow rate can be adjusted at will.

A sensor 8 for detecting plasma emission generated forward of the above-described sputtering vaporization source 2 and a spectroscope 9 for spectroscopically analyzing the plasma emission detected by the sensor 8 are disposed.

The above-described sputtering power source 4, the introduction valves 6 and 7, and the spectroscope 9 are connected to a control unit 10.

This control unit 10 includes a constant-voltage control device 11 to control the voltage of the above-described sputtering power source 4 at a target voltage Vs.

This constant-voltage control device 11 includes a setting portion 12 to set the control target voltage Vs, a monitor portion 13 to detect an output voltage of the power source 4, a comparator 14 to compare the monitor voltage and the above-described target voltage Vs, and an operating portion 15 to control the voltage at a constant value in order that the output voltage becomes the target voltage Vs based on the comparator 14.

The above-described control unit 10 includes a target voltage control device 16 to operate the above-described target voltage Vs in order that the spectrum based on the above-described spectroscope 9 becomes a target value.

This target voltage control device 16 includes a setting portion 17 which sets the target value of the spectrum. The target value of the spectrum set by this setting portion 17 serves as a predetermined value set by the ratio Im/Ig of a spectral intensity Im of the wavelength band intrinsic to the metal element in the plasma emission to a spectral intensity Ig of the wavelength band intrinsic to the reaction gas.

In the above-described spectroscope 9, the ratio Im/Ig of a spectral intensity Im of the wavelength band intrinsic to the metal element in the plasma emission detected by the sensor 8 to a spectral intensity Ig of the wavelength band intrinsic to the reaction gas is determined, and is output as a spectral intensity signal. This spectral intensity signal Im/Ig and the Im/Ig target value set in the above-described setting portion 17 are compared by the comparator 18, and a controlled variable is output by the operation portion 19 to achieve the target value. In the configuration, the target voltage Vs of the setting portion 12 of the above-described constant-voltage control device 11 is set by the controlled variable.

Furthermore, the above-described control unit 10 includes a reaction gas flow rate control device 20 to operate the reaction gas flow rate of the above-described introduction mechanism 5 in order that a sputtering current Ip or an electric power Pp of the above-described power source 4 is set at a target value.

This reaction gas flow rate control device 20 includes a setting portion 21 to set the sputtering current (power) target value, a monitor portion 22 to detect the output current (power) of the power source 4, a comparator 23 to compare the monitor current (power) and the above-described target current (voltage), and an operation portion 24 to control the degree of opening of the reaction gas introduction valve 7 in the above-described introduction mechanism 5 in order that the output current (power) becomes the target value based on the comparator 23.

In the reactive sputtering apparatus having the above-described configuration, the sputtering power source 4 supplies the power required for sputtering to the sputtering vaporization source 2. In this example, the sputtering power source 4 is provided with a control system in the inside of the power source. That is, this control system is provided with the setting portion 12, the comparator 14, operating portion 15, and the like, and has a function of monitoring the output voltage of the sputtering power source 4 and controlling the output voltage at a constant value by adjusting the output of the power source 4 in order that this voltage becomes equal to the voltage Vs given from the outside as the target value.

When the sputtering power source itself has no function of keeping the output voltage constant, the same function can be achieved by disposing a control circuit having a corresponding function in the outside of the power source.

When the power is supplied to the sputtering vaporization source 2 while an inert gas, e.g., argon, is introduced in the vacuum chamber 1 at a predetermined flow rate or pressure with an introduction mechanism 5, glow discharge is generated forward of the sputtering vaporization source 2, sputtering vaporization is started by gas (argon) ions generated during the glow discharge, and a coating is formed on the substrate 3 disposed facing the vaporization source 2.

At this time, when a reactive gas is introduced from the reaction gas introduction valve 7 shown in the drawing, a compound of the metal vaporized from the sputtering vaporization source 2 and the reactive gas is formed on the substrate 3 as a coating. For example, when the target attached to the sputtering vaporization source 2 is aluminum (Al) and the reactive gas is oxygen ($O_2$), a coating of an aluminum oxide (alumina) can be formed.

The apparatus to realize the method of the present invention is provided with the spectroscope 9 to observe the emission spectrum of the glow discharge portion forward of the sputtering vaporization source 2. The spectroscope 9 can monitor the emission intensity of a specific wavelength band in the emission of the glow discharge, and the emission intensity information, e.g., an emission intensity Im of the wavelength band intrinsic to the metal sputtering-vaporized, an emission intensity Ig of the wavelength band intrinsic to the reactive gas, or an emission intensity Ia of the wavelength band intrinsic to the inert gas, can be made available to the control unit 10.

In the case of alumina formation, Im, Ig, and Ia represent intensities of the wavelength bands intrinsic to aluminum, oxygen, and the inert gas, respectively.

The control unit 10 has a configuration in which the information, e.g., the output voltage, current, power, and the like, of the sputtering power source 4 is input in addition to the information from the above-described spectroscope 9, and based on the computation results in the control unit 10, an output voltage set value to the sputtering power source 4 and a gas flow rate command value to the reaction gas introduction valve 7 can be output.

Furthermore, the control unit 10 is provided with a function of setting various control target values for controlling the process of the reactive sputtering.

A specific example of the control of reactive sputtering in the present invention will be described below.

In the present embodiment, the case where alumina is formed by the use of aluminum as the metal to be sputtering-vaporized, oxygen as the reactive gas, and argon as the inert gas. The specifications of the apparatus used for the film formation is as described below.

Vacuum chamber volume: about 0.5 $m^3$.

Vacuum exhaust system: turbo molecular pump having a capacity of 1,800 L/s.

Sputtering vaporization source system: planar magnetron 6 inches×20 inches

Vaporization source (target material): aluminum (Al).

Inert gas: argon.

Reactive gas: oxygen ($O_2$).

Coating: Al.

Sputtering power source: capacity 1,000 V, 15 A, and maximum output 10 Kw.

Initially, an inert gas, argon, was introduced in the chamber 1 at a flow rate of 120 sccm. Subsequently, a reaction gas, oxygen, was introduced at 30 sccm, and the atmosphere in the chamber 1 was stabilized. Under this condition, the sputtering power source 4 was placed into a voltage control mode, a control target value was set at 360 V, and sputtering was started.

Figure 15:
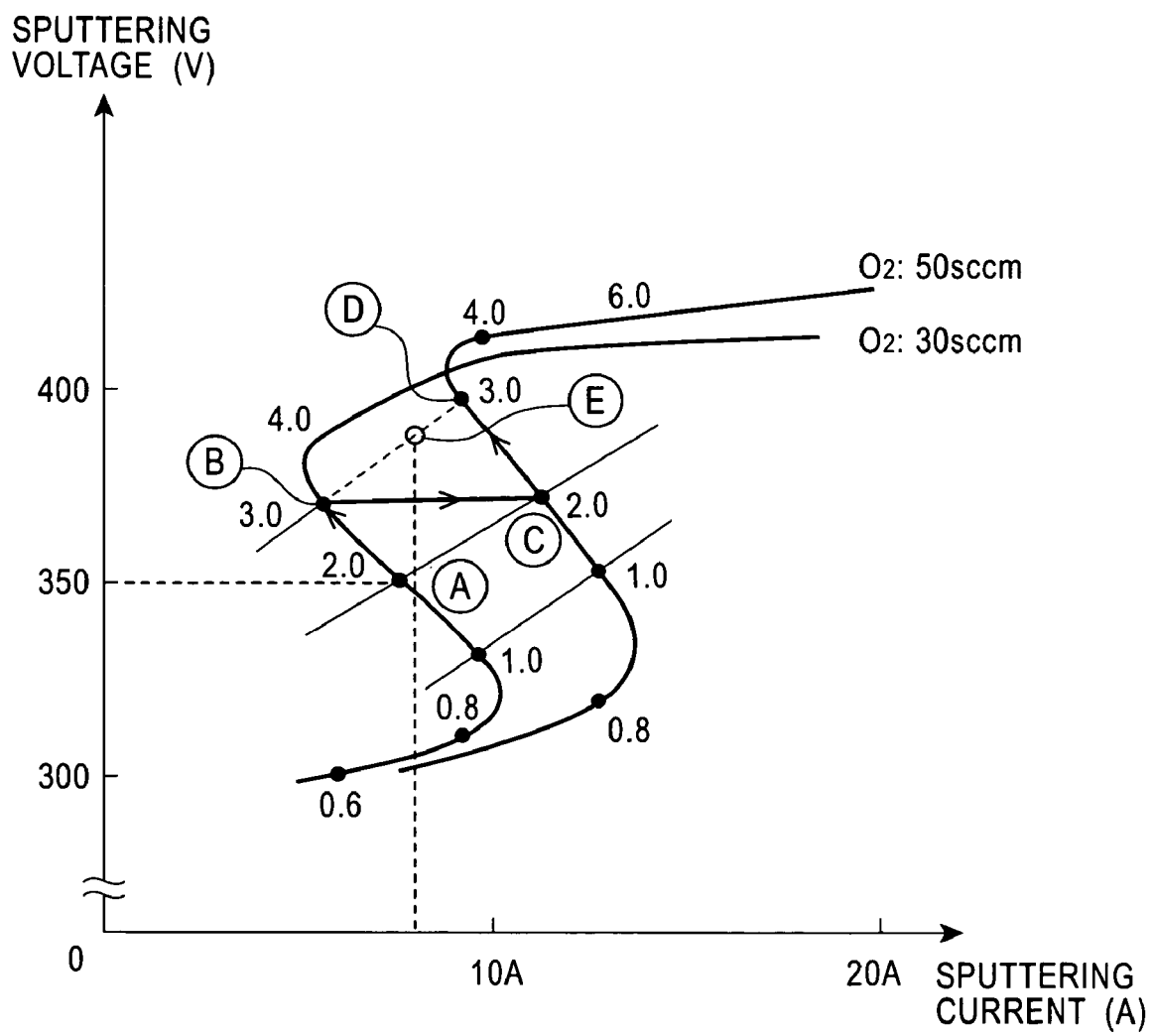
FIG. 15 is a graph showing voltage-current characteristic curves of the sputtering, taken in advance.

FIG. 15 shows voltage-current characteristic curves of the sputtering, taken in advance. According to these curves, when discharge is generated at 360 V, the operation of the reactive sputtering was started in the transition mode (point A shown in the drawing). In this example, the voltage of 360 V in the transition mode was designated as the initial sputtering voltage. However, not specifically limited to this, and an arbitrary voltage on the characteristic curve shown in FIG. 15 may be designated.

On the other hand, when a voltage in the metal mode region is designated, film formation in the metal mode occurs in a short time and there is a risk of formation of a metal film on the substrate 3. Therefore, preferably, a voltage corresponding to the poisoning mode or the transition mode is selected at the start.

After stable discharge is started, the control based on the emission spectrum of the glow discharge is started. In the present example, the control by the use of the ratio Im/Ig of the emission intensity Im of a wavelength (670 nm) intrinsic to aluminum to the emission intensity Ig of a wavelength (778 nm) intrinsic to oxygen as an indicator was adopted, and the control was started with the control target value of 3.0.

Since the voltage is 350 V and the Im/Ig value is in the vicinity of 2.0 at the start of the sputtering, the control unit 10 of the present invention starts the control to increase the set voltage Vs in order that the Im/Ig becomes 3.0. As a result, the operating point of the sputtering vaporization source 2 is moved gradually toward a point B on the characteristic curve shown in FIG. 15, and finally, is settled at the point B.

At this time, it is important that the adjustment of the target voltage Vs by the use of the Im/Ig as the indicator is performed at a sufficiently slow pace compared with that of the constant-voltage control of the sputtering power source 4.

The speed of the target voltage control of the sputtering power source 4 was on the order of several tens milliseconds in the present example, and the adjustment of the target voltage Vs was performed at the speed on the order of seconds. If the speed of the adjustment of the target voltage Vs becomes too high, the voltage control itself becomes significantly unstable due to mutual interference with the constant-voltage control to keep the sputtering voltage constant.

In the present embodiment, by setting the Im/Ig value at within the range of 0.6 to 10 in a similar manner, the reactive sputtering can be controlled stably in an arbitrary mode.

Furthermore, according to the present invention, for example, when the reaction gas flow rate was changed to, for example, 50 sccm, the operating point was shifted temporarily to a point C shown in FIG. 15, but was able to be soon corrected to a predetermined operating point D by the control to adjust the target voltage Vs by the use of the Im/Ig as an indicator, so that the operation was able to be performed stably. Likewise, stable control can be performed against the influence of the residual gas in the chamber 1 and the voltage shift accompanying the deposition of an insulating coating in the chamber 1.

According to the above-described embodiment of the present invention, the reactive sputtering can be stabilized in each of the metal, transition, and poisoning modes. However, in many cases, the setting of parameter of the sputtering is usually controlled by the sputtering current or power and, therefore, it is also required to set the parameter of the sputtering by the sputtering current or power. This is because the sputtering current or power is easily understandable as a parameter correlated to the film formation speed.

When there is such a requirement, it is possible to set the process condition by the sputtering current or power instead of setting the reaction gas flow rate. At this time, the control unit 10 further reads the monitor signal of current value or power value of the sputtering power source 4, and the reaction gas flow rate is adjusted in order that this value agrees with the target current value or power value.

That is, according to the above-described embodiment, when the Im/Ig is kept constant and the reaction gas flow rate is changed, if the change of reaction gas flow rate is sufficiently slow, the shift is performed on a broken line bonding the point B and the point D.

If the adjustment of the reaction gas flow rate is stopped at that point in time when the sputtering current or power becomes a predetermined value during this shift, the sputtering current or power can be controlled at a target value as well.

For example, when the control target of the sputtering current is set at 8 A while the Im/Ig is set at 3.0, the $O_2$ gas flow rate is gradually increased from the operation at the point B, the operating point is shifted on the broken line bonding the points B and D, and finally, the increase of the $O_2$ flow rate is stopped at a point E, so that the sputtering current can be kept at 8 A.

At this time, it is important that the adjustment of the reaction gas flow rate by the use of the sputtering current as the indicator is performed at a sufficiently slow pace compared with the speed of the change in set voltage of the sputtering power source by the use of the Im/Ig as the indicator.

As described above, since the adjustment of the target voltage Vs was performed at the speed on the order of seconds, the adjustment speed of the gas flow rate was in over several tens of seconds. If the speed of the adjustment of the gas flow rate is too high, the control to fix the Im/Ig at the target value becomes unstable due to mutual interference with the control to keep the Im/Ig constant.

Figure 16:
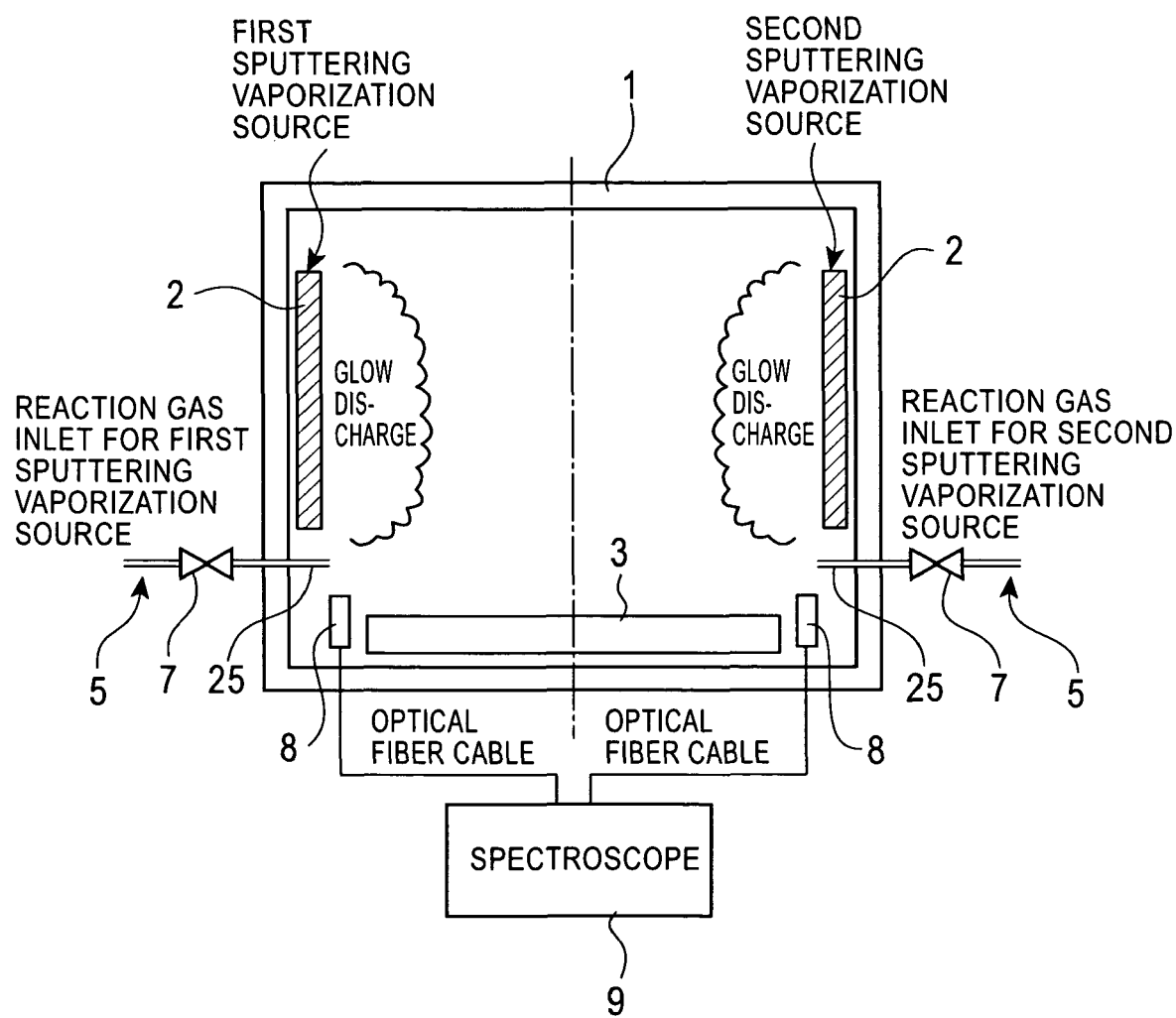
FIG. 16 is a schematic diagram of a reactive sputtering apparatus showing another embodiment of the present invention.

FIG. 16 shows a reactive sputtering apparatus including a plurality of sputtering vaporization sources 2 (cathodes) in a vacuum chamber 1. In this apparatus, a reactive gas inlet 25 of a gas introduction mechanism 5 is independently disposed on a vaporization source 2 basis. In addition, a sensor 8 of a spectroscope 9 is also disposed on a vaporization source 2 basis. The other configuration is essentially the same as that shown in the above-described FIG. 14.

In the reactive sputtering apparatus including a plurality of vaporization sources 2 as described above, when the film formation is performed while the sputtering voltage is kept constant, if surface conditions of the targets 2 are different from each other, the control of the sputtering power becomes difficult depending on the manner of inflow of the reactive gas.

Consequently, each of the plural vaporization sources 2 is provided with a reactive gas inlet 25 and, thereby, the sputtering power can be readily controlled on a vaporization source 2 basis.

That is, in the film formation apparatus including a plurality of vaporization sources 2, each sputtering voltage is controlled at a constant value and, in addition, the amount of introduction of the reactive gas from a gas inlet 25 disposed in the vicinity of each vaporization source 2 is individually adjusted.

For example, when two vaporization sources 2 (targets) having surface conditions different from each other are used simultaneously, since each of the plural vaporization sources 2 is provided with a reactive gas inlet 25, the sputtering power can be adjusted by differentiating the flow rates at the two reactive gas inlets 25. In this case, the plasma emission intensity of each of the two vaporization sources 2 is monitored, and the Im/Ig ratio is controlled at a constant value.

Next, another embodiment of the present invention, including the apparatus shown in the above-described FIG. 14 will be described.

Initially, an inert gas, argon, was introduced in the chamber 1 at a flow rate of 120 sccm. Subsequently, a reaction gas, oxygen, was introduced at 15 sccm, and the atmosphere in the chamber 1 was stabilized.

Figure 17:
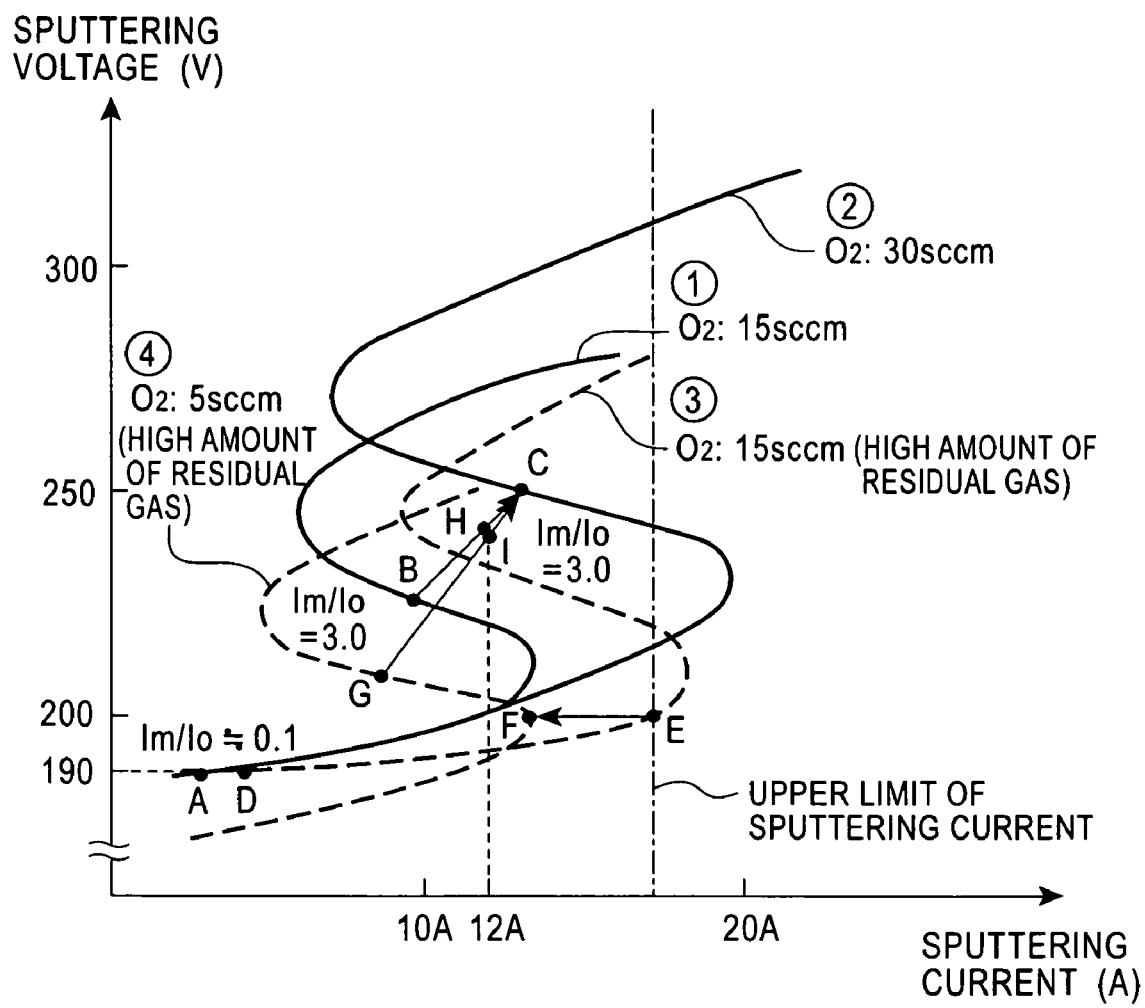
FIG. 17 is a graph showing the relationship between the sputtering current and the sputtering voltage where a parameter is the reactive gas flow rate and another parameter is the amount of residual gas.

FIG. 17 shows sputtering voltage (V)-sputtering current (I) characteristic curves ① and ② of alumina sputtering in the condition in which the power source was in the voltage control mode, taken in advance while the oxygen gas flow rate was set at 15 sccm and 30 sccm in addition to argon. According to these curves, when discharge was generated at an oxygen gas flow rate of 15 sccm at 190 V, the operation of the reactive sputtering was started in the poisoning mode (point A shown in the drawing).

In this example, the voltage of 190 V was selected as the initial sputtering voltage. However, not specifically limited to this, and an arbitrary voltage may be selected as long as it is a sputtering voltage in the poisoning mode region.

After stable discharge is started, the control based on the emission spectrum of the glow discharge is started.

In the present example, the control by the use of the ratio Im/Ig of the emission intensity Im of a wavelength (670 nm) intrinsic to aluminum to the emission intensity Ig of a wavelength (778 nm) intrinsic to oxygen as an indicator was adopted, and the control was started with the control target value Im/Ig=3.0.

Since the sputtering voltage is 190 V and the Im/Ig value is about 0.1 at the start of the sputtering, the control unit of the present invention starts the control to increase the sputtering set voltage Vs in order that the Im/Ig becomes 3.0 targeted.

As a result, the operating point of the sputtering vaporization source is moved gradually toward a point B on the characteristic curve ① shown in FIG. 17, and finally, reaches the point B. At this time, it is important that the adjustment of the Vs by the use of the Im/Ig as the indicator is performed at a sufficiently slow pace compared with that of the constant-voltage control of the sputtering power source. The speed of constant-voltage control was on the order of several tens milliseconds in the present embodiment and, therefore, the target voltage control of the Vs was performed at the speed on the order of seconds. If the speed of the adjustment of the target voltage Vs becomes too high, the voltage control itself becomes significantly unstable due to mutual interference with the constant-voltage control to keep the sputtering voltage constant.

In the above-described example, the discharge point was shifted from the poisoning mode region to the transition mode region only by increasing the sputtering voltage. However, a phenomenon in which the characteristic curve shown in FIG. 17 is deformed or shifted occurs depending on the state of adhesion of the residual gas and the compound in the inside of the chamber or the state of adhesion of the compound to the target.

For example, a characteristic curve ③ indicated by a broken line shown in FIG. 17 represents the case where the oxygen flow rate is 15 sccm and the amount of the residual gas is higher than that in the case where the characteristic curve ① is taken. When sputtering discharge is started on this characteristic curve ③ indicated by the broken line at 190 V (point D) as in the above description, the sputtering current reaches the upper limit value specified based on the apparatus system at about 200 V and, therefore, the sputtering voltage cannot be continuously increased any more along the characteristic curve ③ indicated by the broken line (point E).

Consequently, in this case, a phenomenon in which when the oxygen flow rate is decreased, the characteristic curve is shifted lower-leftward is used. The oxygen flow rate is decreased from 15 sccm to 5 sccm while the sputtering voltage is kept at 200 V and, thereby, the discharge point is shifted from the poisoning mode region to the transition mode region while the Im/Ig value is monitored.

After the Im/Ig value becomes a value in the transition mode region by the above-described operation, that is, after the discharge point enters the transition mode, the operation as in the above-described example may be performed to increase the sputtering voltage continuously and to bring the Im/Ig value close to the target value (point G).

In the above-described example of the characteristic curves ③ and ④ shown in FIG. 17, the oxygen flow rate was decreased from 15 sccm to 5 sccm while the sputtering voltage was kept constant. However, in most cases of actual film formation, an appropriate extent of decrease in the oxygen flow rate is not clear in advance. This is because although it is obvious that when the oxygen flow rate in the poisoning mode is decreased to some extent in a stroke, the discharge point is brought close to the transition mode region or the metal mode region, the discharge point may be shifted to a point nearer to the metal mode region than is the target discharge point and, thereby, a film containing excess metal may be formed.

Therefore, in the actual film formation, it is effective from the viewpoint of the film quality to gradually decrease the oxygen flow rate and to increase the sputtering voltage while the sputtering current value is monitored in order that the value thereof does not exceed an upper limit.

Figure 18:
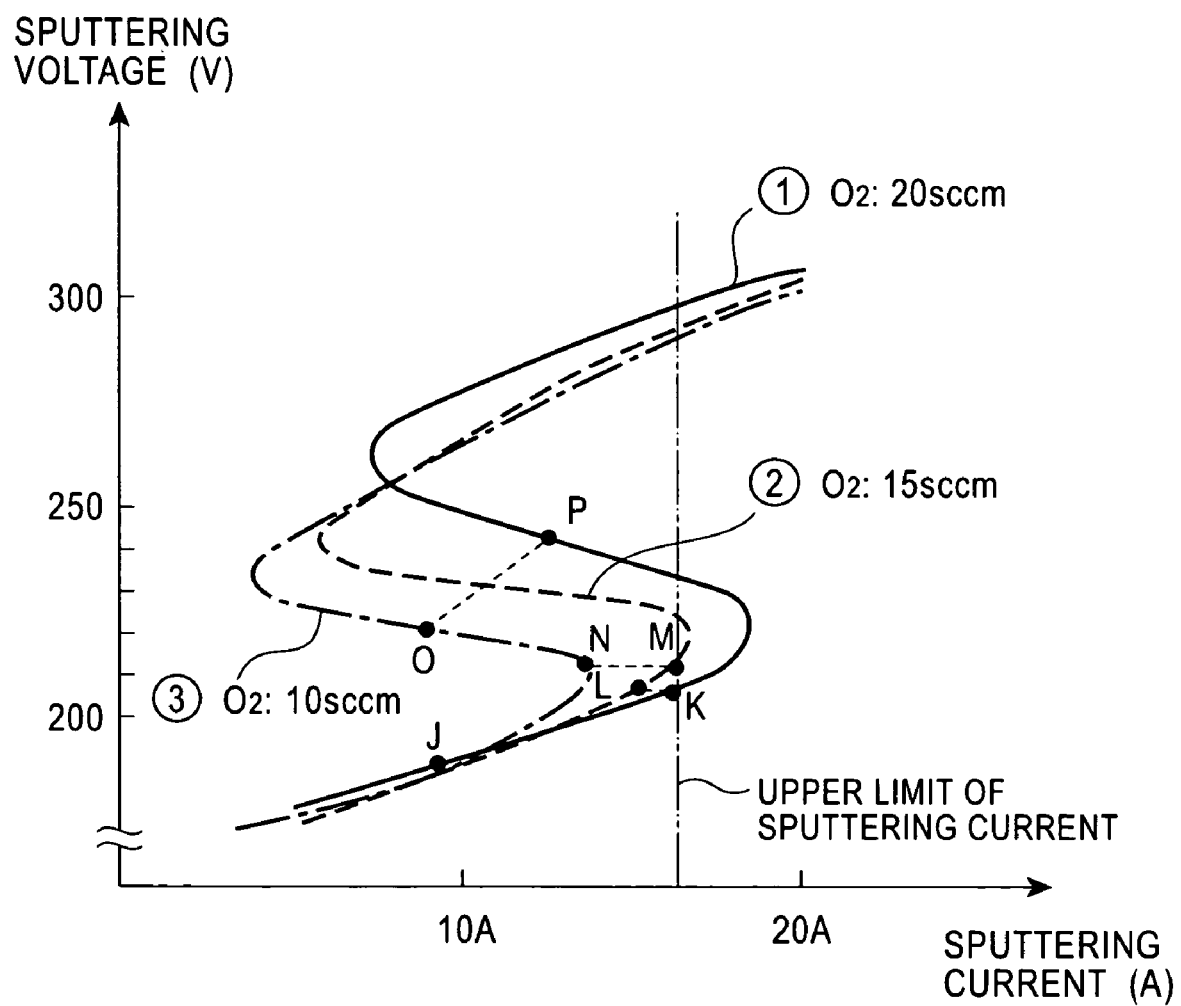
FIG. 18 is an explanatory diagram showing an embodiment of the present invention.

This operation is specifically shown in FIG. 18.

Figure 1:
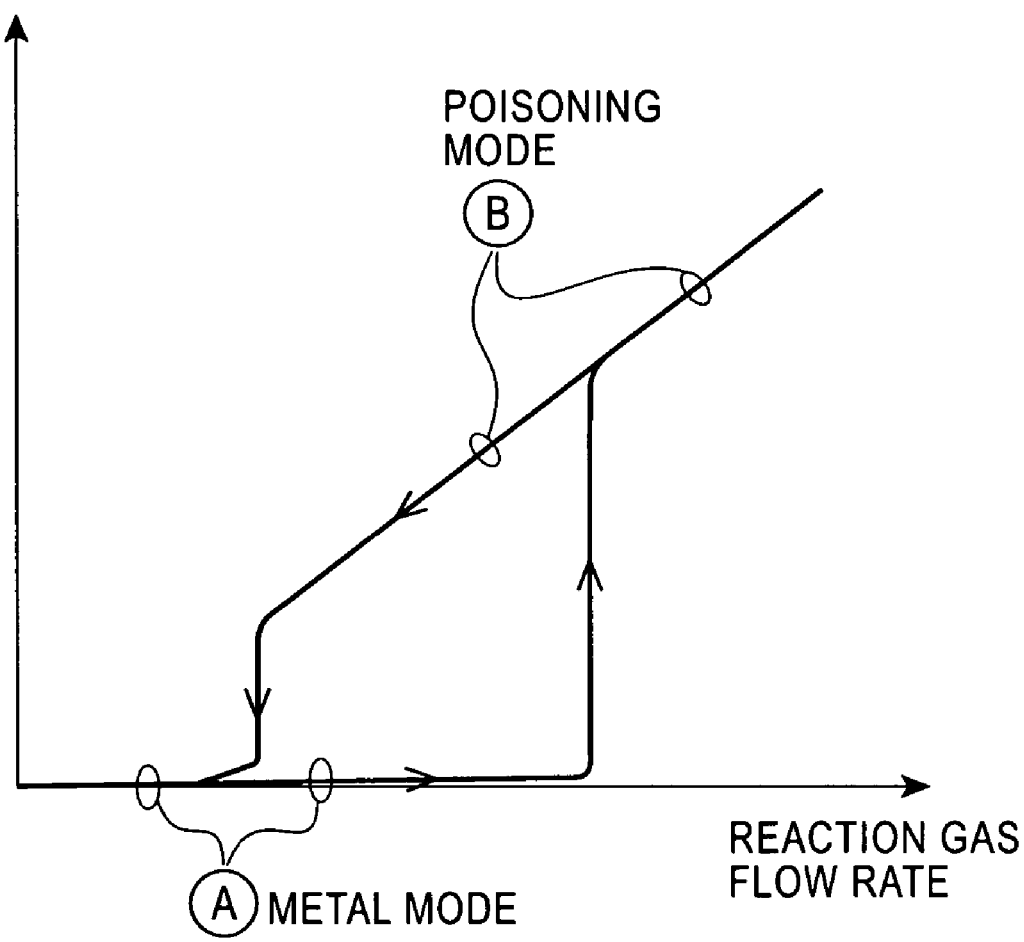
FIG. 1 is a graph showing the relationship between the change in the reaction gas flow rate and the reaction gas partial pressure.
Figure 2:
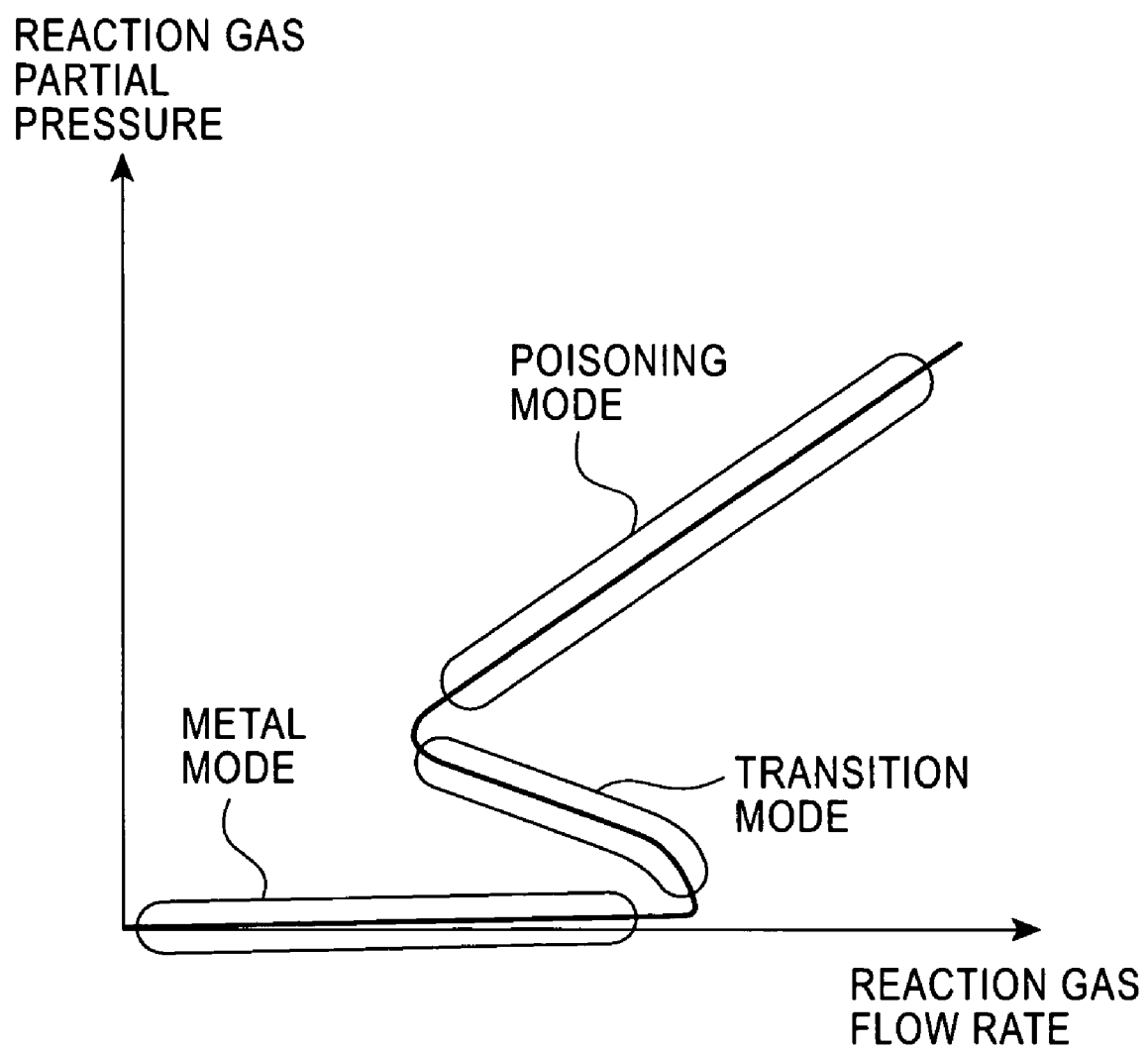
FIG. 2 is a graph showing the relationship between the reaction gas flow rate and the partial pressure in the case where the control is performed in order that the reaction gas partial pressure becomes constant.
Figure 3:
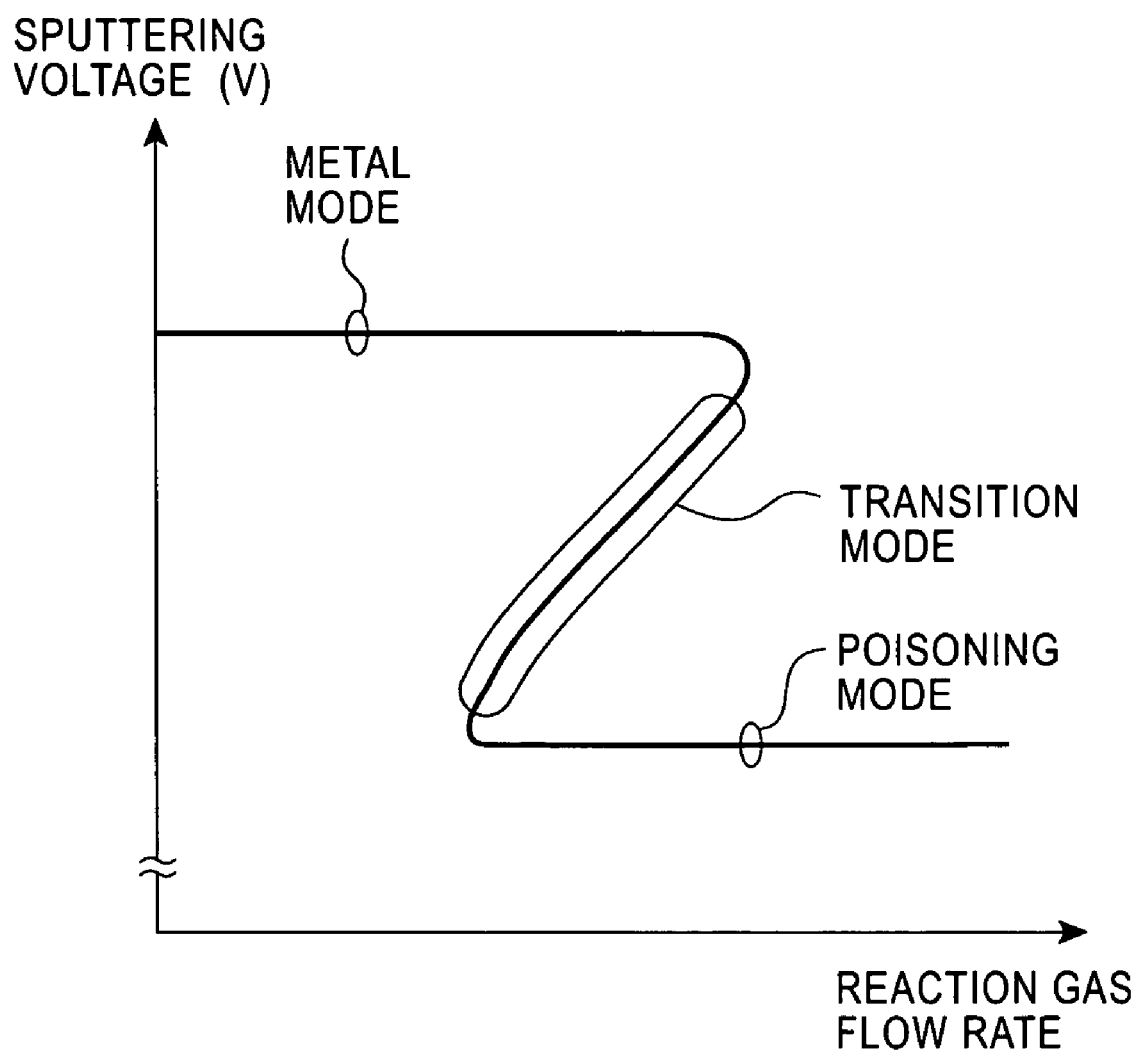
FIG. 3 is a graph showing the relationship between the sputtering voltage and the reaction gas flow rate depending on the film formation mode.
Figure 4:
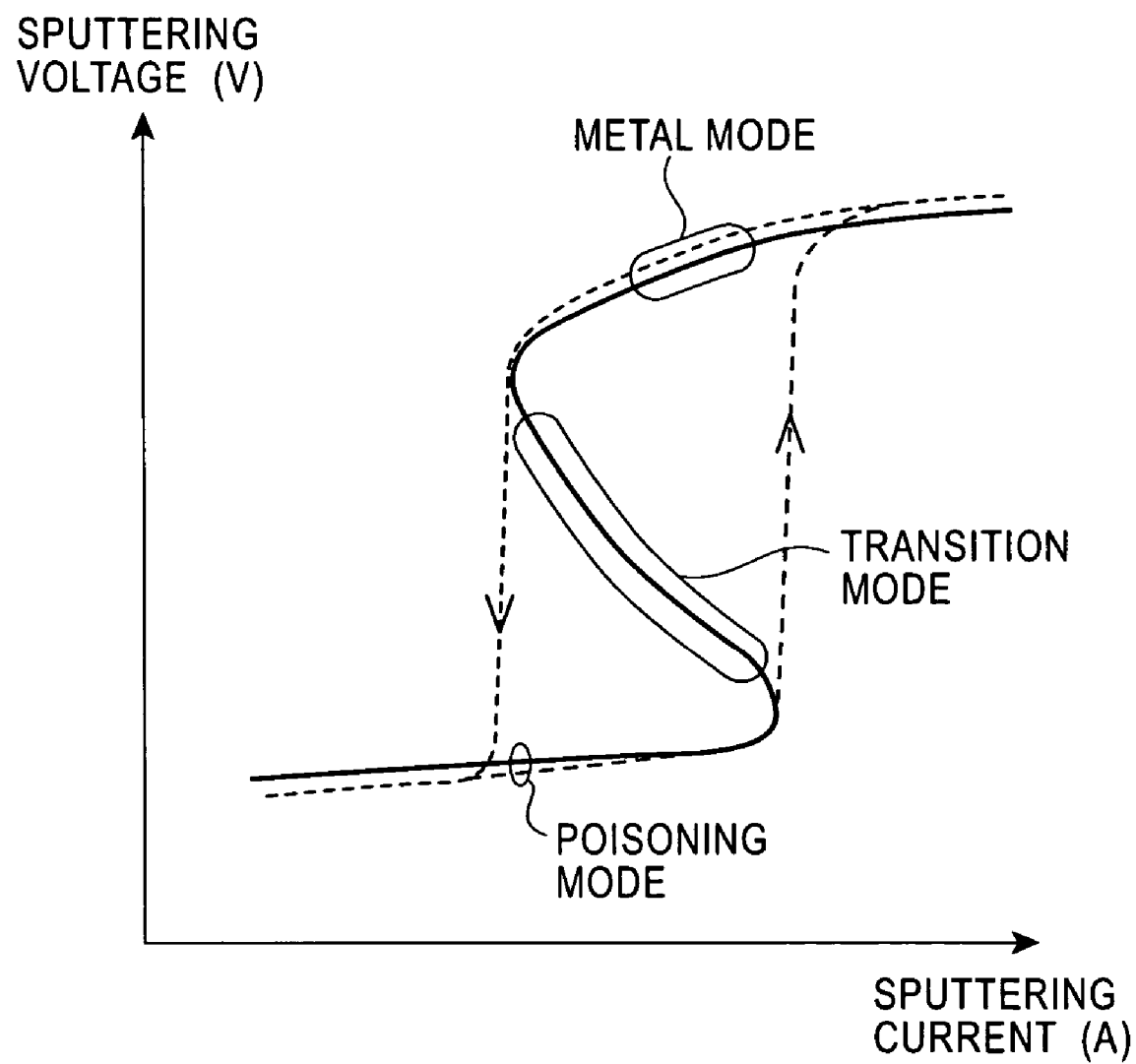
FIG. 4 is a graph showing the relationship between the sputtering voltage and the sputtering current in the case where the constant-voltage control is used.
Figure 5:
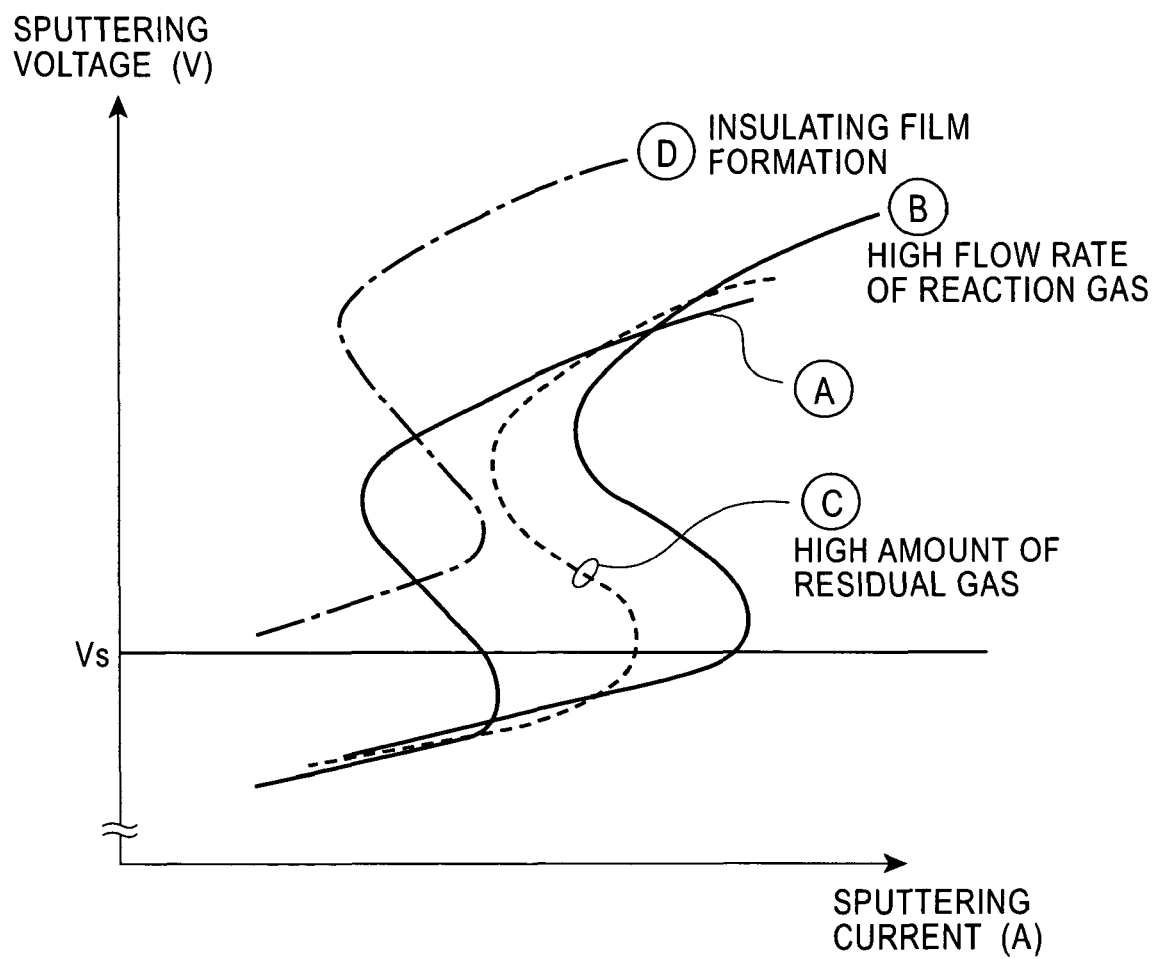
FIG. 5 is a graph showing the relationship between the sputtering voltage and the sputtering current, the graph showing the discharge characteristics in the case where the amount of introduction of the reaction gas is changed in the alumina film formation.
Figure 6:
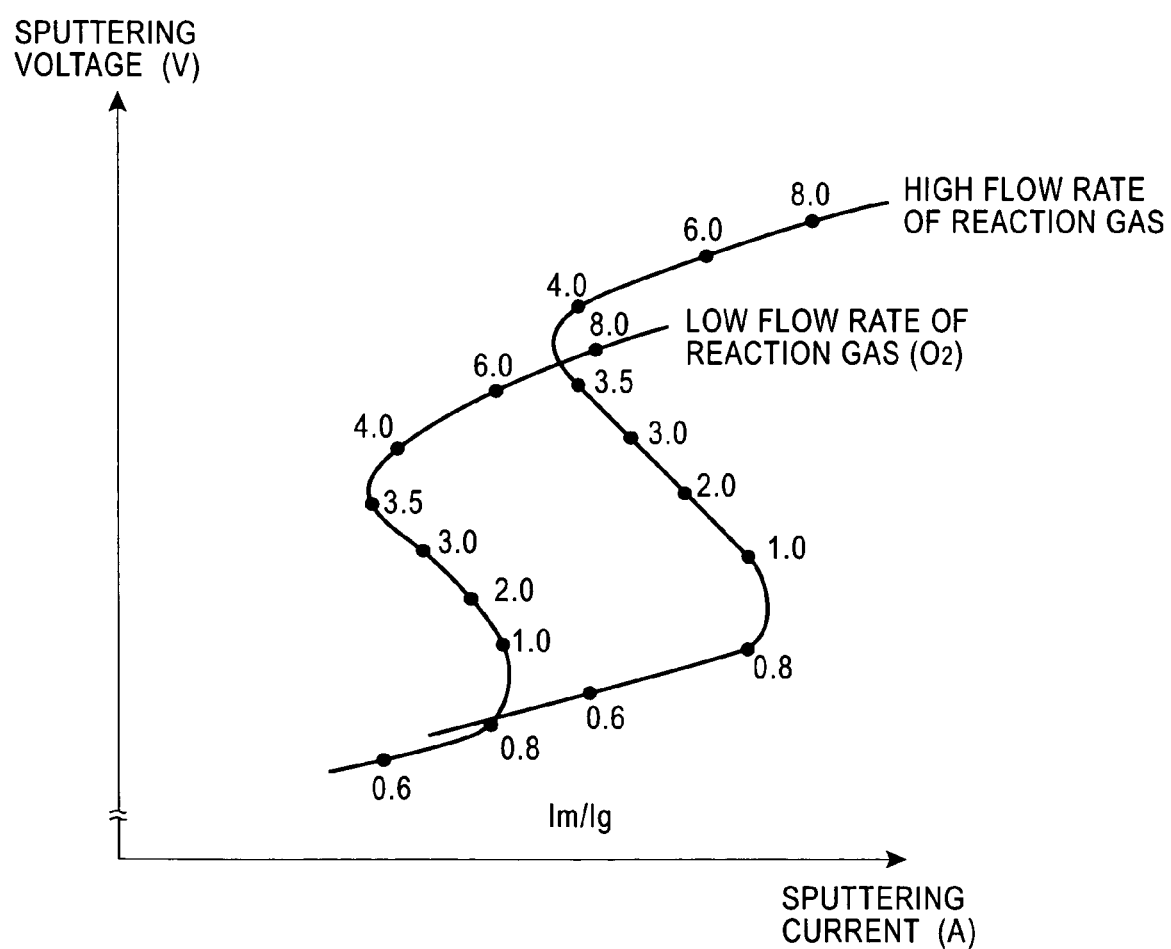
FIG. 6 is a graph showing the relationship between the sputtering voltage and the sputtering current, the graph showing the discharge characteristics in the case where the amount of introduction of the reaction gas is changed in the alumina film formation according to an example of experiments conducted by the inventors of the present invention.
Figure 7:
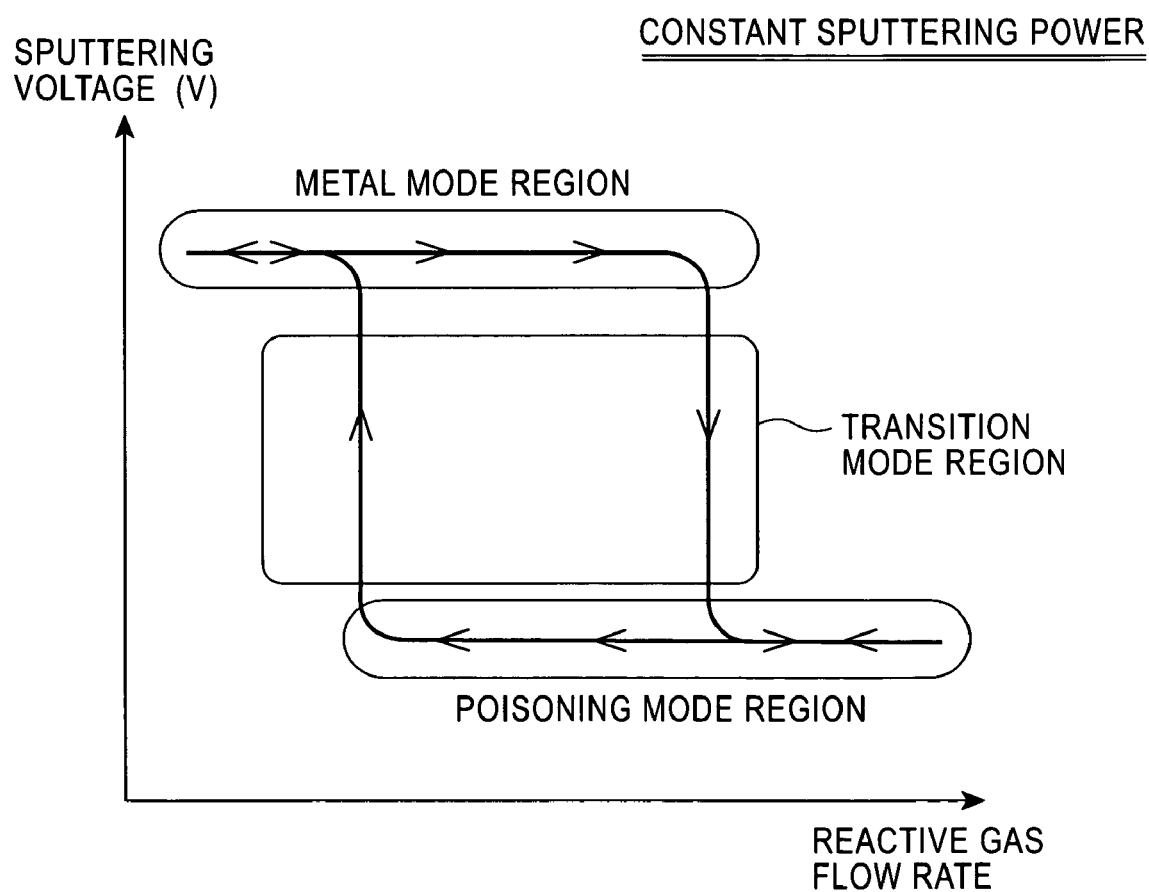
FIG. 7 is a graph showing the relationship between the reactive gas flow rate and the sputtering voltage under the condition of constant sputtering power in the reactive sputtering.
Figure 8:
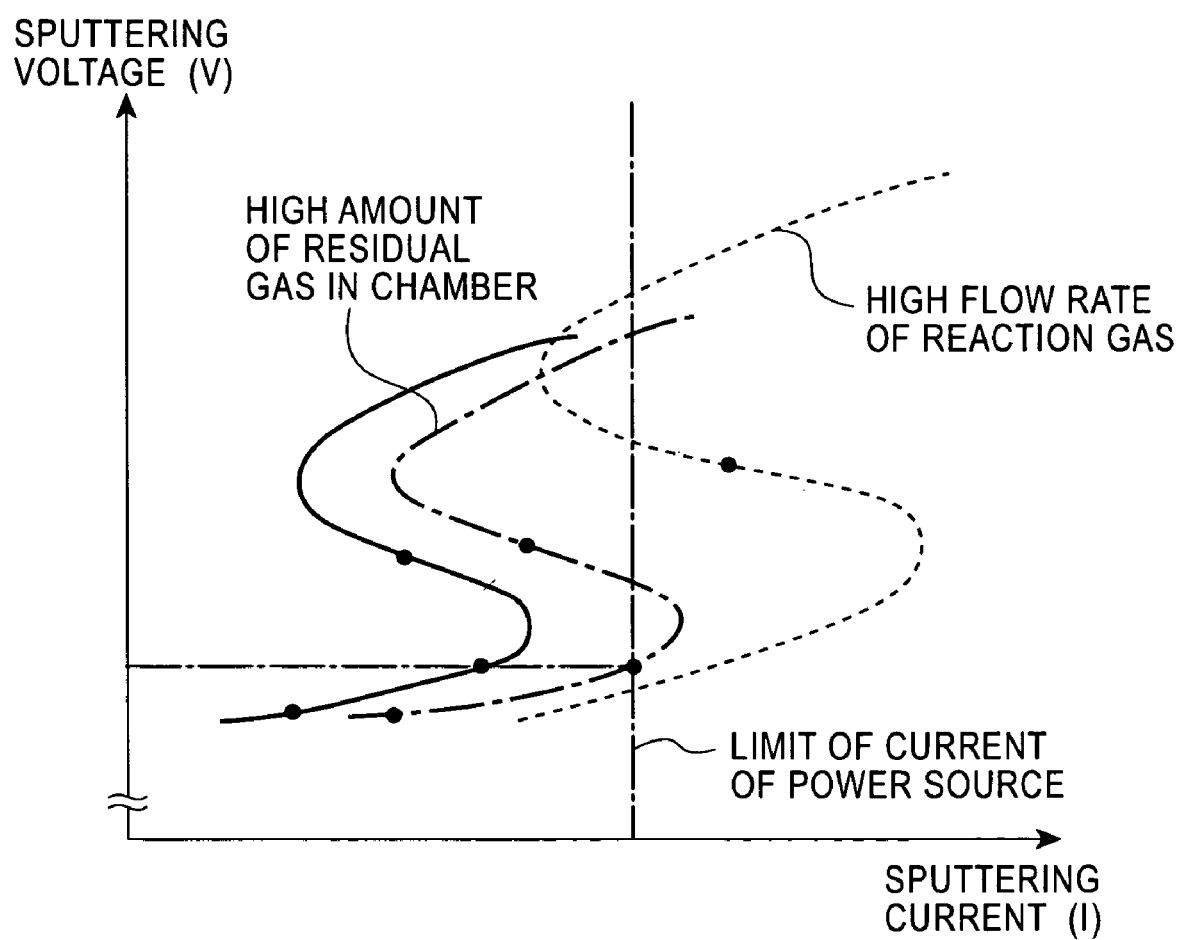
FIG. 8 is a graph showing the relationship between the sputtering current and the sputtering voltage where a parameter is the reactive gas flow rate.
Figure 9:
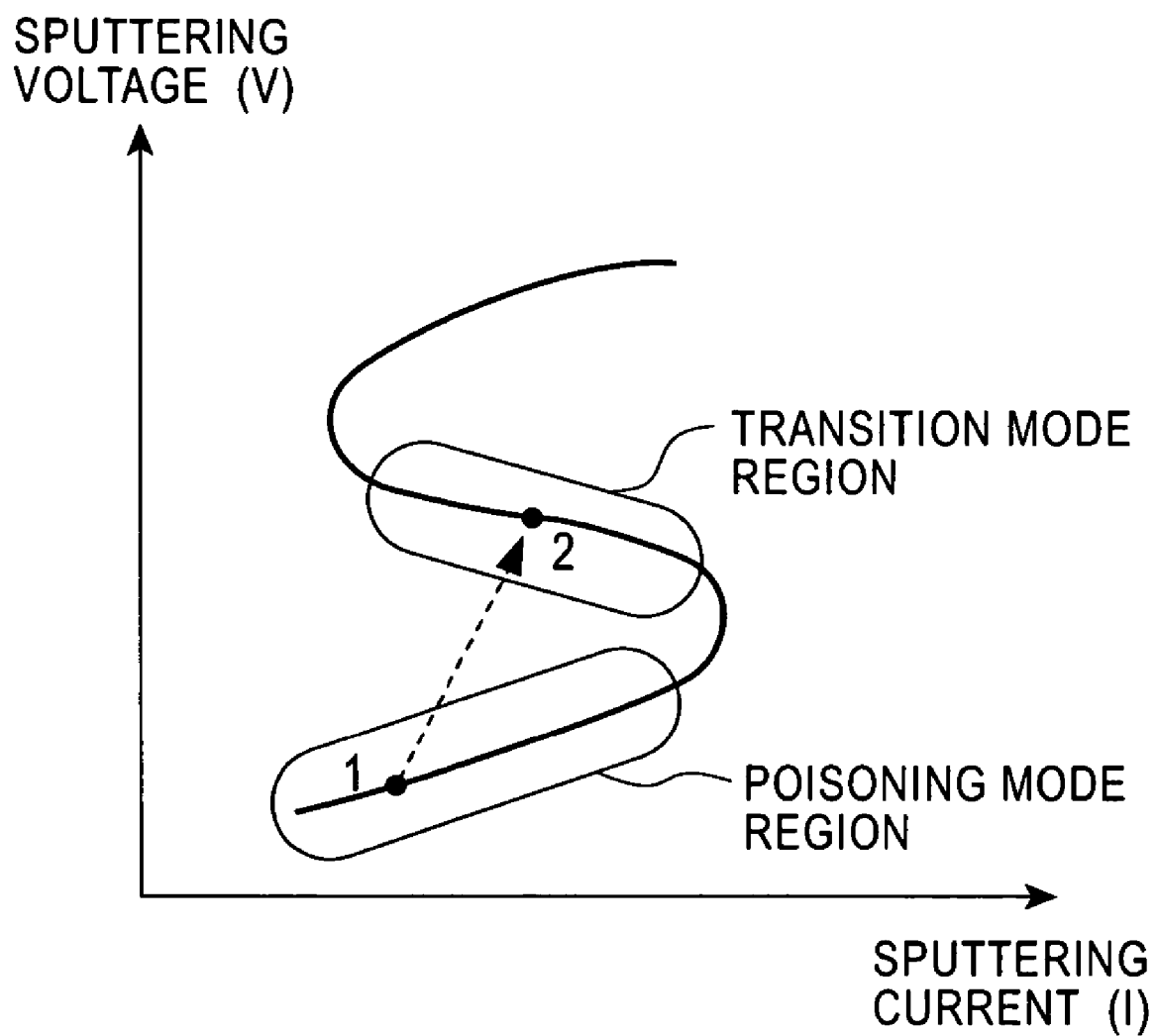
FIG. 9 is a graph showing the relationship between the sputtering current and the sputtering voltage in the reactive sputtering, and is an explanatory diagram showing that the sputtering voltage is controlled in order to start the sputtering discharge in a poisoning mode region and, thereafter, the sputtering voltage is controlled in order to shift the sputtering discharge to a transition mode region.
Figure 10:
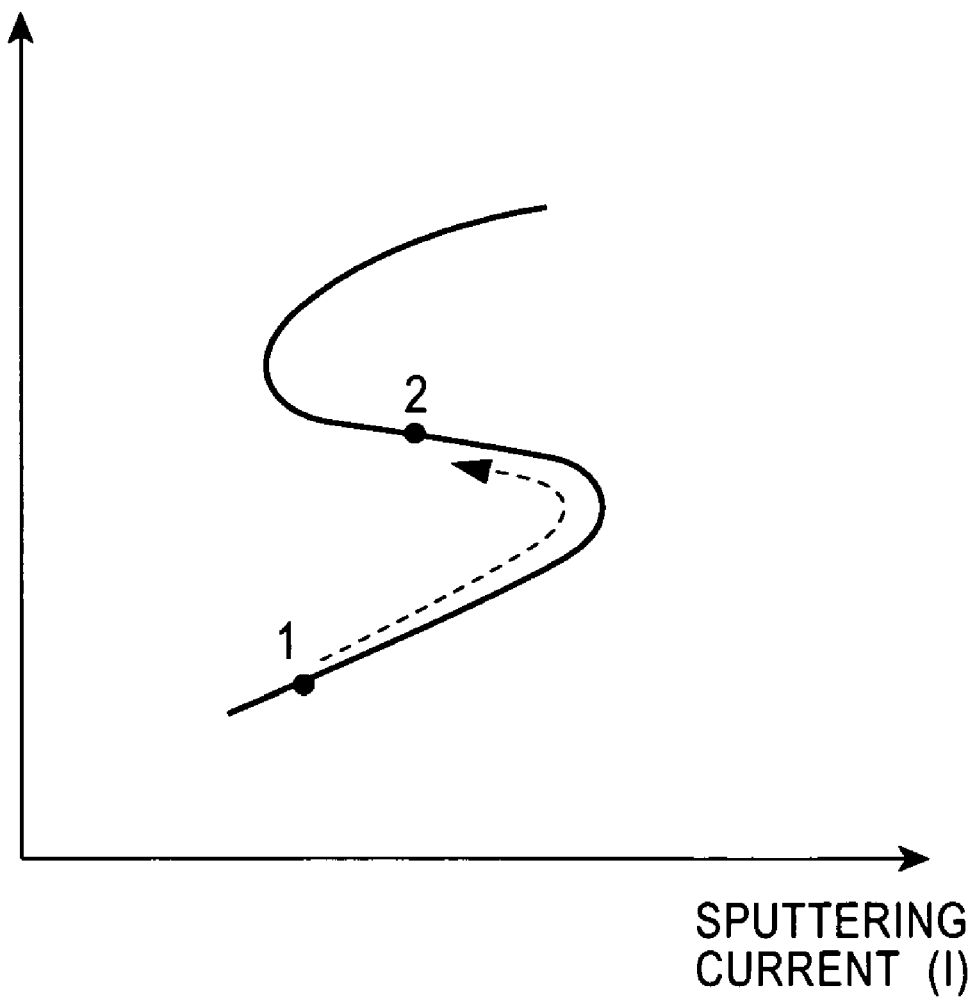
FIG. 10 is a graph showing the relationship between the sputtering current and the sputtering voltage in the reactive sputtering, and is an explanatory diagram showing that the shift from the poisoning mode region to the transition mode region is effected by increasing the sputtering voltage continuously.
Figure 11:
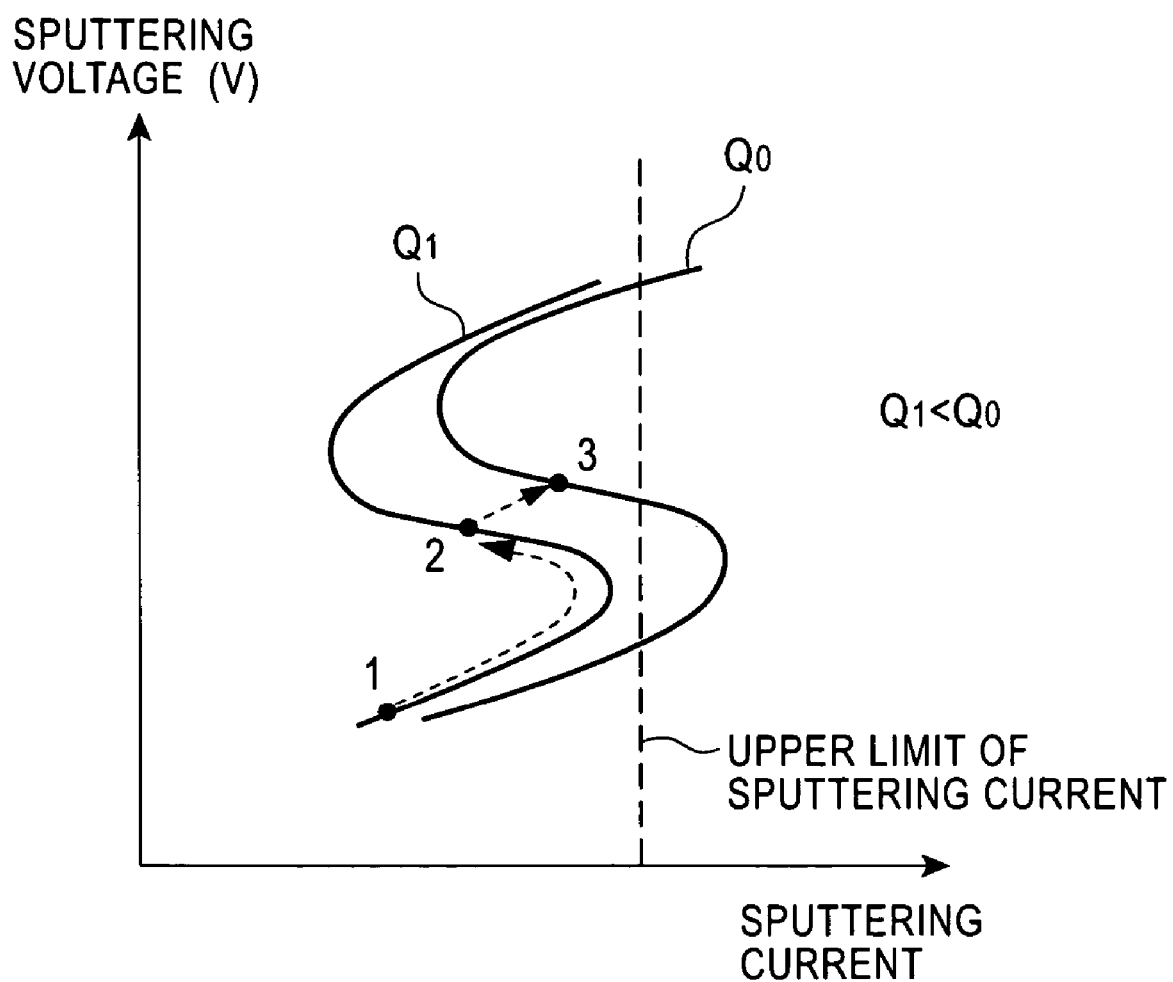
FIG. 11 is a graph showing the relationship between the sputtering current and the sputtering voltage in the reactive sputtering, and is an explanatory diagram showing that the amount of introduction of the reactive gas is set at an amount Q1 lower than a predetermined amount Q0 at the start of the sputtering discharge, the sputtering voltage is increased while the amount of introduction of the reactive gas is kept at the above-described Q1 so as to effect the shift to the transition mode region, and subsequently, the amount of introduction of the reactive gas is increased to the above-described predetermined amount Q0 while the transition mode region is maintained.
Figure 12:
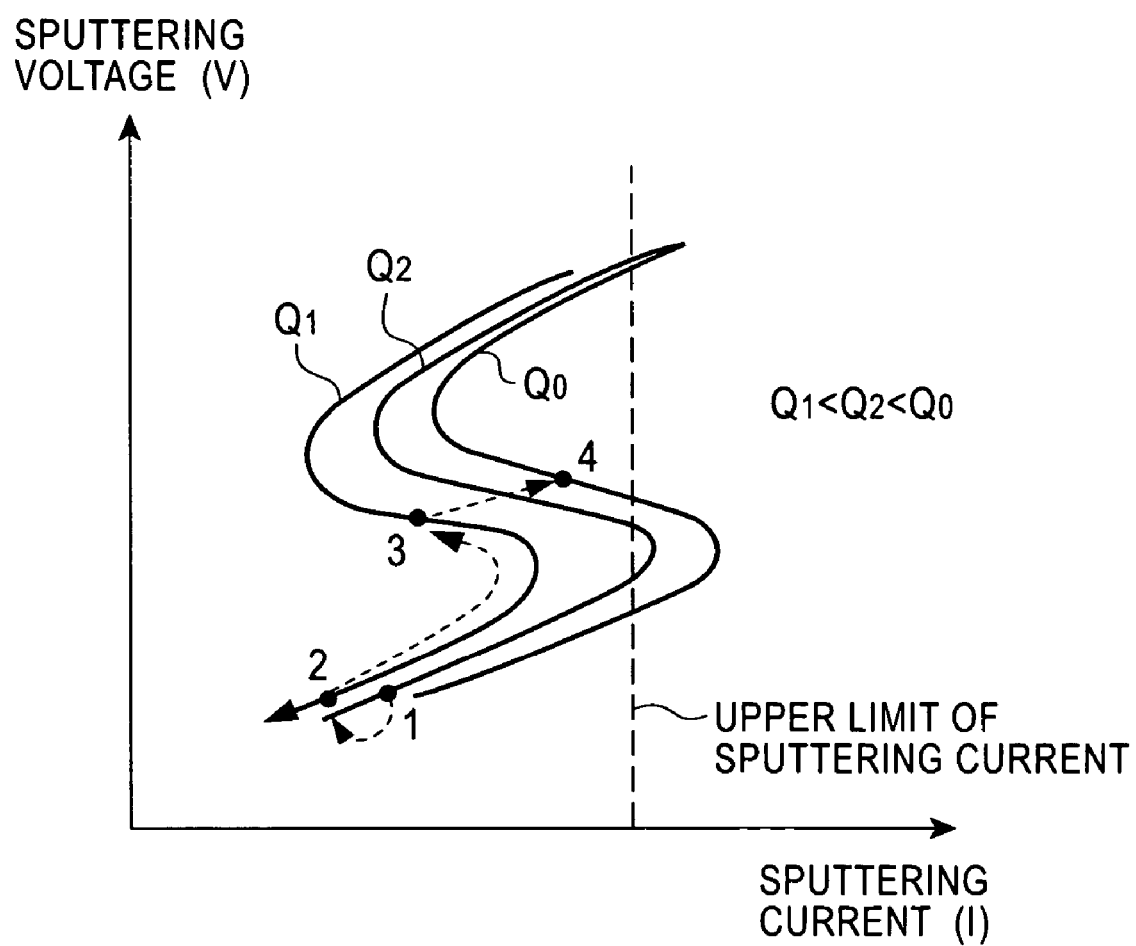
FIG. 12 is a graph showing the relationship between the sputtering current and the sputtering voltage in the reactive sputtering, and is an explanatory diagram showing that the amount of introduction of the reactive gas is set at an amount Q2 lower than a predetermined amount Q0 at the start of the sputtering discharge, the reactive gas flow rate is reduced to the amount Q1 lower than the above-described Q2 while the poisoning mode region is maintained, the sputtering voltage is increased while the amount of introduction of the reactive gas is kept at the above-described Q1 so as to effect the shift to the transition mode region, and subsequently, the amount of introduction of the reactive gas is increased to the above-described predetermined amount Q0 while the transition mode region is maintained.
Figure 13:
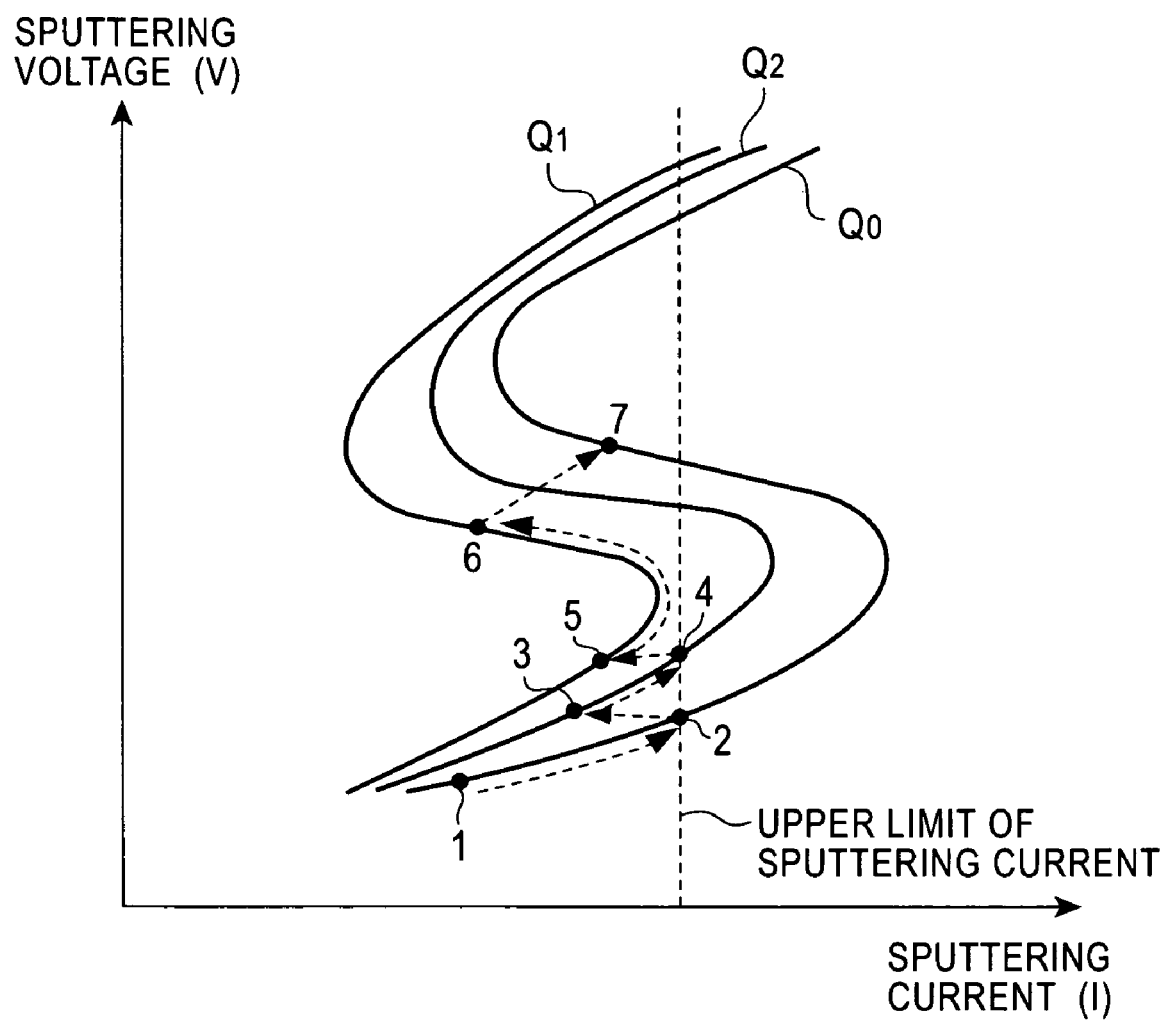
FIG. 13 is a graph showing the relationship between the sputtering current and the sputtering voltage in the reactive sputtering, and is an explanatory diagram showing that the amount of introduction of the reactive gas is set at a predetermined amount Q0 at the start of the sputtering discharge, and subsequently, the sputtering voltage is increased while the amount of introduction of the reactive gas is adjusted in order that the sputtering current value does not exceed a predetermined value, so as to effect the shift to the transition mode region.

In FIG. 8, when an initial oxygen flow rate is set at 20 sccm, plasma ignition is effected at a point J in the poisoning mode region, and when the discharge point is shifted to a point K (205 V) by sputtering voltage operation, the sputtering current reaches an upper limit value, about 17 A, of the system. Then, the oxygen flow rate is decreased to 15 sccm while the sputtering voltage is kept constant at 205 V, and the discharge point is shifted from the point K to a point L. Since the sputtering current value is lowered, the sputtering voltage is further increased.

When the sputtering voltage reaches 210 V, the sputtering current value reaches the upper limit value again (point M). Therefore, the oxygen flow rate is decreased to 10 sccm as in the above description.

It is made clear by monitoring the Im/Ig value that the discharge point is present in the neighborhood of the boundary between the transition mode region and the poisoning mode region (point N) at an oxygen flow rate of 10 sccm at a sputtering voltage of 210 V. Thereafter, the sputtering voltage is increased while the oxygen flow rate is kept constant and, thereby, the discharge point is shifted from the point N to a point O in order that the target Im/Ig value is attained.

According to the above-described embodiment, in the reactive sputtering, stable sputtering discharge can be performed in the transition mode targeted. However, in many cases, the setting of parameter of the sputtering is usually controlled by the sputtering current or the sputtering power and, therefore, it is also required to set the parameter of the sputtering by the sputtering current or the sputtering power. This is because the sputtering current or the sputtering power is easily understandable as a parameter correlated to the film formation speed.

In such a case, it is possible to set the process condition by the sputtering current or the sputtering power instead of setting a constant reaction gas flow rate. At this time, the control unit further reads the monitor signal of current value or power value of the sputtering power source, and the reaction gas flow rate is adjusted in order that this value agrees with the target sputtering current value or sputtering power value.

That is, according to the above-described embodiment, when the Im/Ig value is kept constant and the reaction gas flow rate is changed, if the change of reaction gas flow rate is sufficiently slow, the shift is performed along a curve bonding the point B or a point G and a point C shown in FIG. 17.

The reason the position of the point C does not depend on the amount of the residual gas is that when the absolute value of the oxygen flow rate is relatively increased, the influence of the residual gas becomes negligibly small.

If the adjustment of the reactive gas flow rate is stopped at that point in time when the sputtering current or the sputtering power becomes a desired value during this shift, the sputtering current or the sputtering power can be controlled at a target value as well.

For example, when the control target of the sputtering current is set at 12 A while the target Im/Ig value is set at 3.0, the oxygen gas flow rate is gradually increased from the operation at the point B or the point G shown in FIG. 17, the operating point is shifted along the curve bonding the points B and C or points G and C, and finally, the increase of the oxygen flow rate is stopped at a point H or a point I, so that the sputtering current can be kept at 12 A targeted.

At this time, it is important that the adjustment of the reactive gas flow rate by the use of the sputtering current as the indicator is performed at a sufficiently slow pace compared with the speed of the change in set voltage of the sputtering power source by the use of the Im/Ig as the indicator. As described above, since the adjustment of the Vs was performed at the speed on the order of seconds, the adjustment speed of the gas flow rate was in over several tens of seconds. If the speed of the adjustment of the gas flow rate is too high, the control to fix the Im/Ig value at the target value becomes unstable due to mutual interference with the control to keep the Im/Ig value constant.

Up to this point, the combination in which the vaporization metal was aluminum and the reactive gas was oxygen was described as the embodiment of the present invention. However, the method of the present invention can be applied to any compound formation by the reactive sputtering other than this. Typical examples of compounds to which the present invention can be applied include $Al_2O_3$, AlN, $TiO_2$, $SiO_x$, $Ta_2O_5$, TiN, $SnO_2$, ITO, ZnO, and mixtures thereof.

The method for reactive sputtering of the present invention was described with reference to the pulsed DC sputtering by the planar magnetron. However, the method of the present invention can be applied to any sputtering system including the sputtering systems exemplified below as long as the system is reactive sputtering.

1, Magnetron and non-magnetron sputtering.
2, Planar sputtering vaporization source and cylindrical sputtering vaporization source.
3, Various electric power drive systems of DC, pulsed DC, MF, RF, and the like.
4, Single magnetron sputtering system and dual magnetron sputtering system.

INDUSTRIAL APPLICABILITY

The present invention can be used in the industry in which a compound coating of a metal and a reaction gas is formed on a substrate.

The invention claimed is:

1. A method for reactive sputtering using a reactive sputtering apparatus including a sputtering vaporization source provided with a metal target disposed in a vacuum chamber, a sputtering power source to drive the sputtering vaporization source, and an introduction mechanism to introduce an inert gas for sputtering and a reaction gas for forming a compound with sputtered metal into the vacuum chamber, comprising the steps of:
performing reactive sputtering film formation on a substrate disposed in the vacuum chamber, wherein a plasma emission is generated forward of the sputtering vaporization source;
performing target voltage control to set a target voltage Vs for the sputtering vaporization source based on the spectrum of the plasma emission generated forward of the sputtering vaporization source; and
performing constant-voltage control to control the voltage of the sputtering power source to be the target voltage Vs by comparing an actual output voltage of the sputtering power source to the target voltage Vs, and issuing an output voltage control command based on a difference between the actual output voltage of the sputtering power source and the target voltage Vs, wherein a control speed of the constant voltage control is higher than a control speed of the target voltage control,
wherein the control response time Tv of the constant-voltage control is within the range of 0.1 milliseconds to 0.1 seconds and the control response time To of the target voltage control is within the range of 0.1 seconds to 60 seconds.

2. The method for reactive sputtering according to claim 1, further comprising the step of setting a target value of the spectrum based on a ratio of a spectral intensity Im of the wavelength band intrinsic to the metal element in the plasma emission to a spectral intensity Ig of the wavelength band intrinsic to the reaction gas.

3. The method for reactive sputtering according to claim 1, further comprising the step of setting a target value of the spectrum based on a ratio of a spectral intensity Im of the wavelength band intrinsic to the metal element in the plasma emission to a spectral intensity Ia intrinsic to the inert gas.

4. The method for reactive sputtering according to claim 1, further comprising the step of performing reaction gas flow rate control in order that a sputtering current Ip or an electric power Pp of the power source becomes a target value.

5. The method for reactive sputtering according to claim 4, wherein the control response time Ti of the reaction gas flow rate control is within the range of 10 seconds to 1,800 seconds.

6. The method for reactive sputtering according to claim 1, wherein the step of performing reactive sputtering film formation is performed on a plurality of substrates movably disposed in the vacuum chamber, wherein said target voltage control step includes a step of averaging the spectrum of the plasma emission generated forward of the sputtering vaporization source during the control response time To.

7. A method for reactive sputtering using a reactive sputtering apparatus including a sputtering vaporization source provided with a metal target disposed in a vacuum chamber, a sputtering power source to drive the sputtering vaporization source, and an introduction mechanism to introduce an inert gas for sputtering and a reaction gas for forming a compound with sputtered metal into the vacuum chamber, comprising the steps of:
performing reactive sputtering film formation on a substrate disposed in the vacuum chamber, wherein a plasma emission is generated forward of the sputtering vaporization source;
detecting the plasma emission generated forward of the sputtering vaporization source;
comparing the measured spectrum of the plasma emission generated forward of the sputtering vaporization source with a target value of the plasma emission generated forward of the sputtering vaporization source;
outputting a target voltage Vs for the sputtering vaporization source based on the step of comparing the measured spectrum of the plasma emission generated forward of the sputtering vaporization source with a target value of the plasma emission generated forward of the sputtering vaporization source, wherein the steps of detecting the plasma emission and comparing the measured spectrum together have a response time within the range of 0.1 seconds to 60 seconds;
detecting the output voltage of the sputtering power source;
comparing the detected output voltage of the sputtering power source with the target voltage Vs;
outputting a control command to the sputtering power source based on the step of comparing the detected output voltage of the sputtering power source with the target voltage;
detecting a measure of the output power of the sputtering power source;
comparing the detected measure of the output power of the sputtering power source with a target measure of the output power of the sputtering power source; and
controlling a reaction gas flow parameter for the reactive sputtering film formation step based on the step of comparing the detected measure of the output power of the sputtering power source with a target measure of the output power of the sputtering power source.

8. The method for reactive sputtering according to claim 7, wherein the step of performing reactive sputtering film formation is performed on a plurality of substrates movably disposed in the vacuum chamber, further comprising a step of averaging the spectra of the plasma emissions generated forward of the sputtering vaporization source by the plurality of substrates, wherein said step of comparing the measured spectrum comprises comparing the averaged measured spectra of the plasma emissions with the target value.

* * * * *